(12) United States Patent
Shin et al.

(10) Patent No.: US 10,537,026 B2
(45) Date of Patent: Jan. 14, 2020

(54) ELECTRONIC DEVICE

(71) Applicant: LG ELECTRONICS INC., Seoul (KR)

(72) Inventors: Choonghwan Shin, Seoul (KR); Yongtae Kim, Seoul (KR); Byunghwa Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 79 days.

(21) Appl. No.: 15/396,953

(22) Filed: Jan. 3, 2017

(65) Prior Publication Data

US 2017/0196102 A1 Jul. 6, 2017

(30) Foreign Application Priority Data

Jan. 4, 2016 (KR) .......................... 10-2016-0000278
Jan. 4, 2016 (KR) .......................... 10-2016-0000280

(51) Int. Cl.
| | | |
|---|---|---|
| *H05K 1/18* | (2006.01) | |
| *G01R 33/07* | (2006.01) | |
| *G06F 1/16* | (2006.01) | |
| *H05K 1/02* | (2006.01) | |
| *H05K 1/11* | (2006.01) | |

(Continued)

(52) U.S. Cl.
CPC ........... *H05K 1/189* (2013.01); *G01R 33/072* (2013.01); *G06F 1/1605* (2013.01); *G06F 1/1607* (2013.01); *G06F 1/1652* (2013.01); *H05K 1/028* (2013.01); *H05K 1/111* (2013.01); *H05K 5/0017* (2013.01); *H05K 5/023* (2013.01); *H05K 5/0217* (2013.01); *G06F 3/03545* (2013.01); *H05K 2201/051* (2013.01); *H05K 2201/052* (2013.01); *H05K 2201/10128* (2013.01)

(58) Field of Classification Search
CPC ........................................................ G03B 21/58
USPC .......................................................... 359/461
See application file for complete search history.

(56) References Cited

U.S. PATENT DOCUMENTS 7,184,209 B2 * 2/2007 Simonsen .............. G03B 21/56
353/46
9,844,152 B2 * 12/2017 Heo .................. G02F 1/133305
(Continued)

FOREIGN PATENT DOCUMENTS

KR 10-2008-0058683 6/2008
KR 10-2009-0006606 1/2009
(Continued)

OTHER PUBLICATIONS

International Search Report dated Sep. 27, 2016 issued in Application No. PCT/KR2016/002025.

*Primary Examiner* — Christopher E Mahoney
(74) *Attorney, Agent, or Firm* — KED & Associates, LLP

(57) ABSTRACT

An electronic device is disclosed. The electronic device includes a housing, a roller positioned inside the housing, a display panel rollable on the roller, and a guide roller positioned at an edge inside the housing. A state of the display panel with respect to the roller includes a first state in which the display panel is rolled on the roller and a second state in which the display panel is unrolled from the roller. The roller includes an outer frame which rotates when the display panel is rolled on or unrolled from the roller, and an inner frame positioned inside the outer frame and fixed to an inside of the housing regardless of rolling and unrolling the display panel.

39 Claims, 27 Drawing Sheets

(51) Int. Cl.
*H05K 5/00* (2006.01)
*H05K 5/02* (2006.01)
*G06F 3/0354* (2013.01)

(56) References Cited

U.S. PATENT DOCUMENTS

| | | | |
|---|---|---|---|
| 2005/0162740 A1* | 7/2005 | Hou | G03B 21/56 |
| | | | 359/461 |
| 2008/0150885 A1* | 6/2008 | Overwijk | G02F 1/1391 |
| | | | 345/107 |
| 2011/0203754 A1 | 8/2011 | Mullet et al. | |
| 2013/0314762 A1* | 11/2013 | Kwack | G02F 1/09 |
| | | | 359/280 |
| 2016/0034000 A1* | 2/2016 | Lee | G06F 1/1652 |
| | | | 361/749 |
| 2016/0209879 A1* | 7/2016 | Ryu | G06F 1/1601 |

FOREIGN PATENT DOCUMENTS

| | | |
|---|---|---|
| KR | 10-1383092 | 4/2014 |
| WO | WO 2010/011030 | 1/2010 |

\* cited by examiner (a)

(b)

(a)

(b)

(a)  (b)

(a)

(b)

(a)

(b)

(a)

(b)

(a)

(b)

(a)

(b)

(a)

(b)

(a)

(b)

(a)

(b)

ELECTRONIC DEVICE

This application claims priority under 35 U.S.C. § 119 to Korean Application No. 10-2016-0000278 and Korean Patent Application No. 10-2016-0000280 filed on Jan. 4, 2016, whose entire disclosures are hereby incorporated by reference.

BACKGROUND

1. Field

The present disclosure relates to an electronic device. More specifically, the present disclosure relates to an electronic device, in which various electronic parts can be mounted inside an inner frame because the inner frame does not rotate regardless of rolling and unrolling a display panel.

2. Background

With the development of the information society, various demands for electronic devices have been increasing. Hence, electronic devices have increasingly more functions. Examples of the functions include data and voice communications, taking pictures and video using a camera, recording audio, playing music files using a speaker system, and displaying images and video on a display. Some electronic devices include additional functionality which supports game playing, while other electronic devices are configured as multimedia players. More recently, the electronic devices have been configured to receive broadcast and multicast signals which permit viewing of content such as videos and television programs.

As the electronic devices have increasingly more functions, the electronic devices have been implemented as multimedia players of multiple functions having taking pictures and video, playing music files or video, game playing, receiving broadcast, etc.

BRIEF DESCRIPTION OF THE DRAWINGS

The embodiments will be described in detail with reference to the following drawings in which like reference numerals refer to like elements wherein.

DETAILED DESCRIPTION

Figure 1:
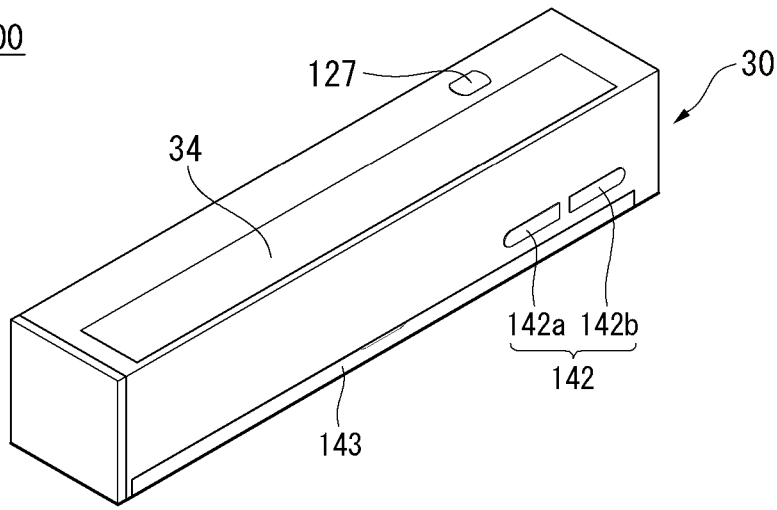
FIGS. 1 to 20 illustrate configuration of an electronic device according to an embodiment of the disclosure.
Figure 1:
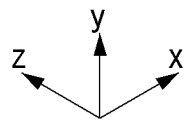
Figure 1:
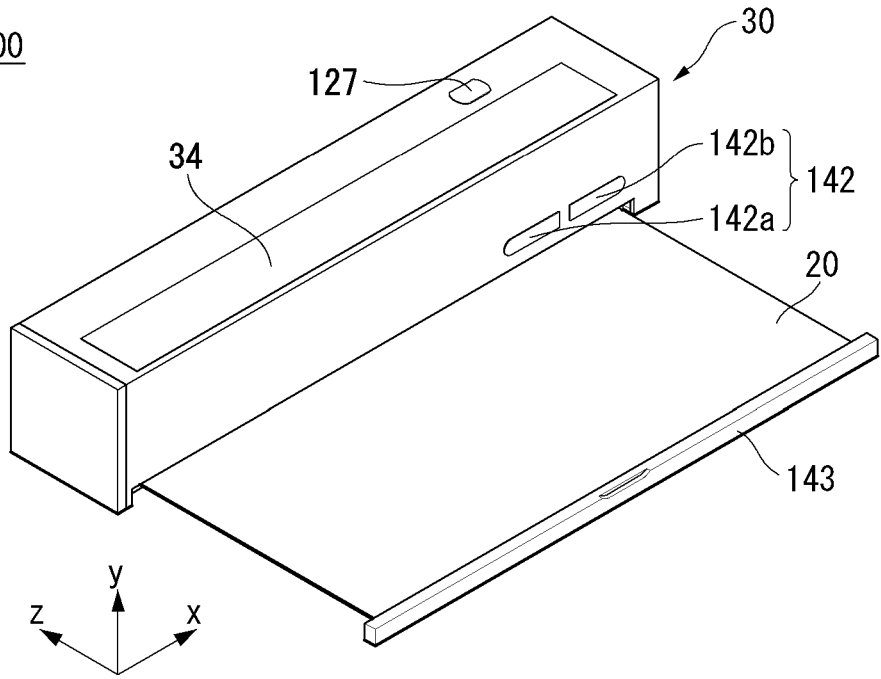
Figure 1:
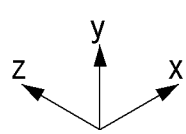

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components. For example, a first component may be designated as a second component without departing from the scope of the present disclosure. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary must be understood to have meanings identical to those used in the context of a related art, and are not to be construed to have ideal or excessively formal meanings unless they are obviously specified in the present application.

The following embodiments of the present disclosure are provided to those skilled in the art in order to describe the present disclosure more completely. Accordingly, shapes and sizes of elements shown in the drawings may be exaggerated for clarity.

Electronic devices disclosed herein may be implemented using a variety of different types of devices. Examples of such devices include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of electronic devices. However, such teachings apply equally to other types of electronic devices, such as those types noted above. In addition, these teachings may also be applied to stationary terminals such as digital TV, desktop computers, and the like.

Hereinafter, embodiments of the disclosure are described using an organic light emitting diode (OLED) display panel as an example of a display panel, but are not limited thereto. Other display panels may be used. For example, a liquid crystal display (LCD) panel, a plasma display panel (PDP), and a field emission display (FED) panel may be used.

FIGS. 1 to 20 illustrate configuration of an electronic device according to an embodiment of the disclosure.

Referring to FIG. 1, an electronic device 100 according to an embodiment of the disclosure may include a display panel 20 and a housing 30.

The housing 30 may shield a plurality of components for operating the electronic device 100. Thus, the housing 30 may protect the plurality of components from an external impact and may provide a neat appearance of the electronic device 100.

The display panel 20 may be in one of a first state in which the display panel 20 is positioned inside the housing 30, and a second state in which the display panel 20 is exposed to the outside of the housing 30. When the display panel 20 is in the first state, the display panel 20 may be rolled on a roller positioned inside the housing 30. When the display panel 20 is changed from the first state to the second state, the display panel 20 may be unrolled from the roller and may be exposed to the outside of the housing 30.

The display panel 20 may be an OLED display panel. However, embodiments of the disclosure are not limited thereto. For example, the display panel 20 may be an LCD panel.

A knob 143 may be positioned at an end of the housing 30. The knob 143 may be pulled out of the housing 30. When the knob 143 is pulled out, the display panel 20 may spread. The knob 143 may be thicker than display panel 20 so that a user can easily hold and pull out the knob 143.

In the electronic device 100 according to the embodiment of the disclosure, the display panel 20 may be in one of the first state and the second state. Hence, only when the user watches the electronic device 100, the display panel 20 may be exposed to the outside of the housing 30 and may perform a space-saving function.

Figure 2:
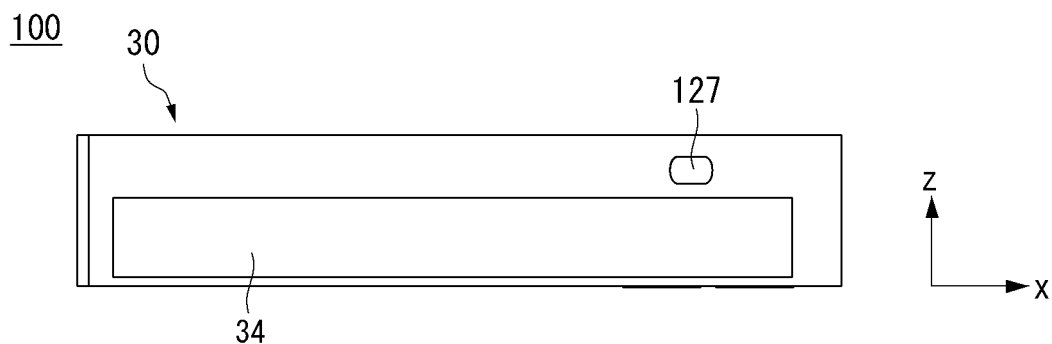
Figure 2:
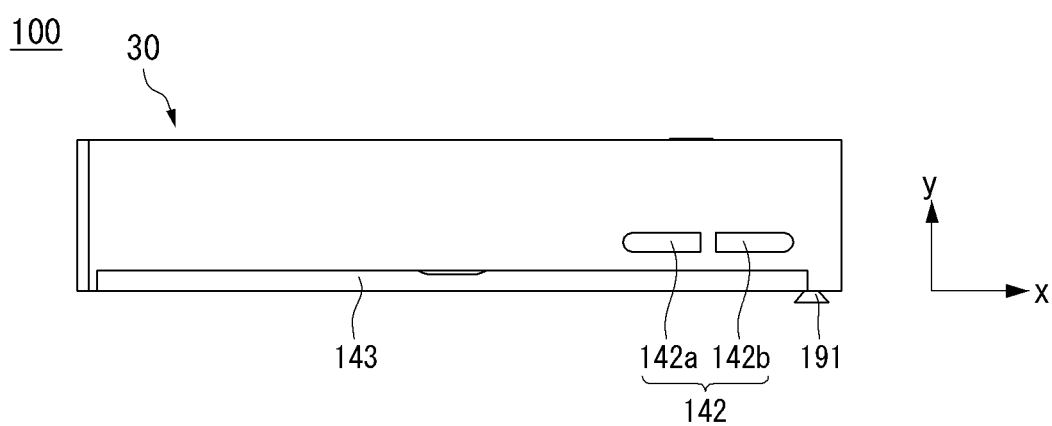
Figure 2:
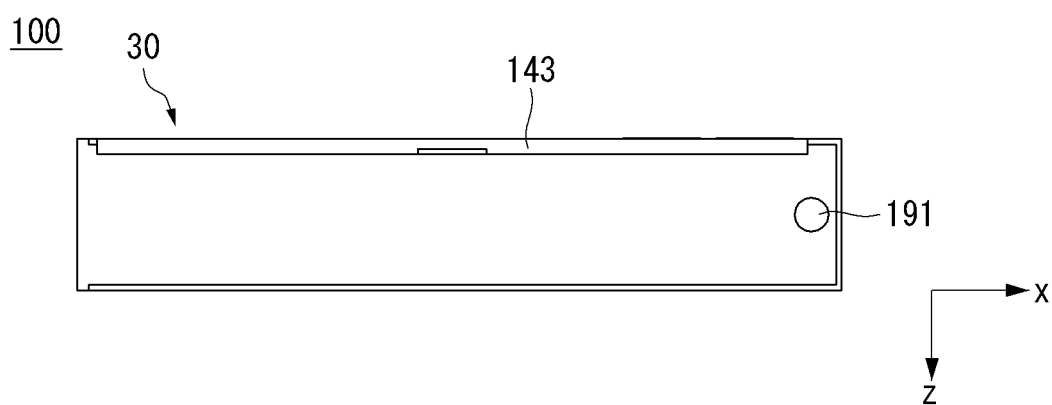

Referring to FIG. 2, the electronic device 100 according to the embodiment of the disclosure may include various buttons and various components on the housing 30.

A window 34 and a power button 127 may be positioned on an upper surface of the housing 30. The window 34 may include a material with light transmission. Namely, the user may see the inside of the housing 30 through the window 34. For example, the window 34 may include glass or tempered glass.

The power button 127 may be spaced apart from the window 34. The power button 127 may turn on or off the electronic device 100. The user may turn on or off the electronic device 100 through a long touch or a short touch of the power button 127. The power button 127 may be one of a touch button and a push button.

A control button 142 and the knob 143 may be positioned on one side of the housing 30 in a direction of the z-axis. The control button 142 may be spaced apart from the knob 143. The control button 142 may include first and second control buttons 142a and 142b. The first and second control buttons 142a and 142b may be spaced apart from each other and positioned opposite each other. For example, the first and second control buttons 142a and 142b may perform a volume control or a motion control of an object on a display screen.

A camera 191 may be positioned on a lower surface of the housing 30. The camera 191 may protrude from the housing 30. The camera 191 may process an image frame, such as a still image and a video, obtained by an image sensor. The processed image frame may be displayed on the display panel 20 and stored in a memory. The camera 191 may perform a function of taking pictures and video. FIG. 2 illustrates that the camera 191 is positioned on the lower surface of the housing 30. However, embodiments of the disclosure are not limited thereto. For example, the camera 191 may be positioned on the side or the upper surface of the housing 30, so that a bottom surface of the housing 30 is flat.

Figure 3:
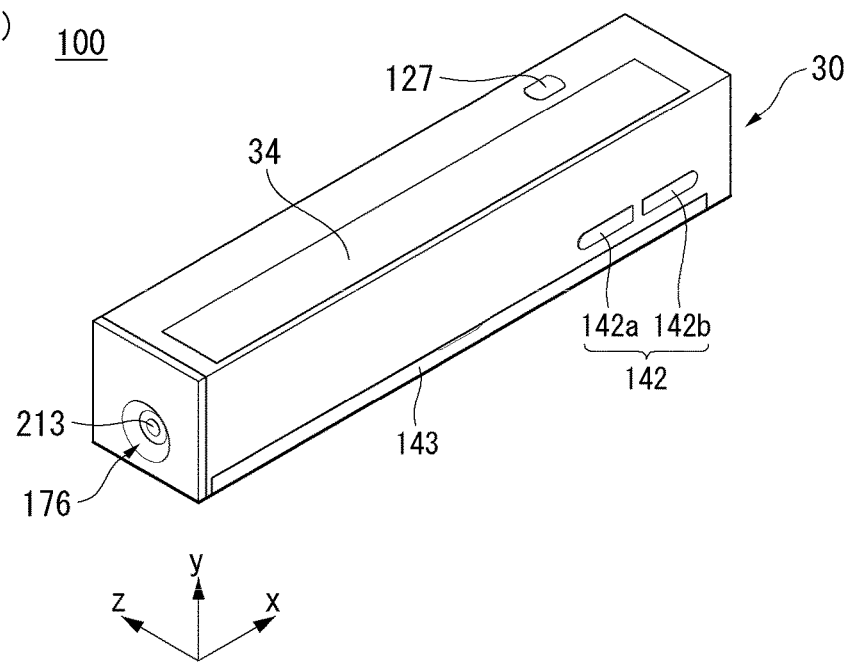
Figure 3:
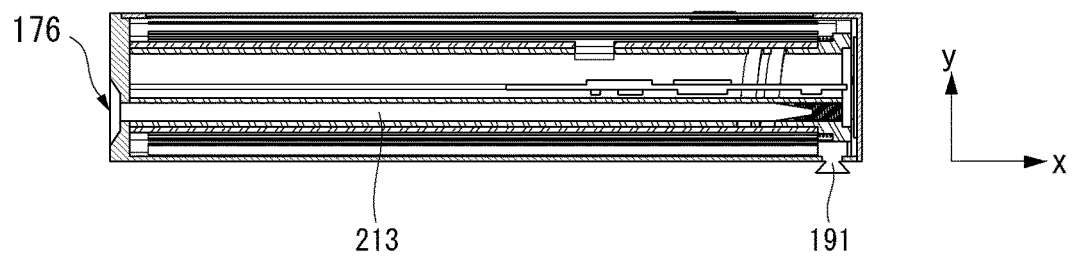

Referring to FIG. 3, an insertion hole 176 may be positioned at one side of the housing 30 in a direction of the x-axis. The insertion hole 176 may have a shape depressed toward the inside of the housing 30. The insertion hole 176 may be a portion into which a touch pen 213 is inserted. A diameter of the insertion hole 176 on the housing 30 may be greater than a diameter of the insertion hole 176 that is depressed to the inside of the housing 30. Hence, the user may easily insert the touch pen 213 into an entrance of the insertion hole 176.

Because the touch pen 213 is inserted into the inside of the housing 30, a length of the touch pen 213 may be less than a width of the housing 30 in the x-axis direction.

The display panel 20 may include a capacitive sensor (not shown) sensing a capacitance of a touched portion of the display panel 20. The capacitive sensor may include a plurality of sensor arrays that is insulated from one another. Because the sensor arrays are insulated from one another, the adjacent sensor arrays may not be affected by capacitances sensed by the adjacent sensor arrays. Further, because the sensor arrays are insulated from one another, the sensor arrays can prevent a ghost phenomenon resulting from a multi-touch. The ghost phenomenon is a phenomenon in which when two or more locations are touched, all of multi-touched locations are not detected, and a center point of the multi-touched locations is recognized as a touch point. The capacitive sensor may sense a portion touched by the touch pen 213 and may transfer a touch signal to a controller. When the controller recognizes the touch signal, the controller may generate an event corresponding to a touch operation.

Figure 4:
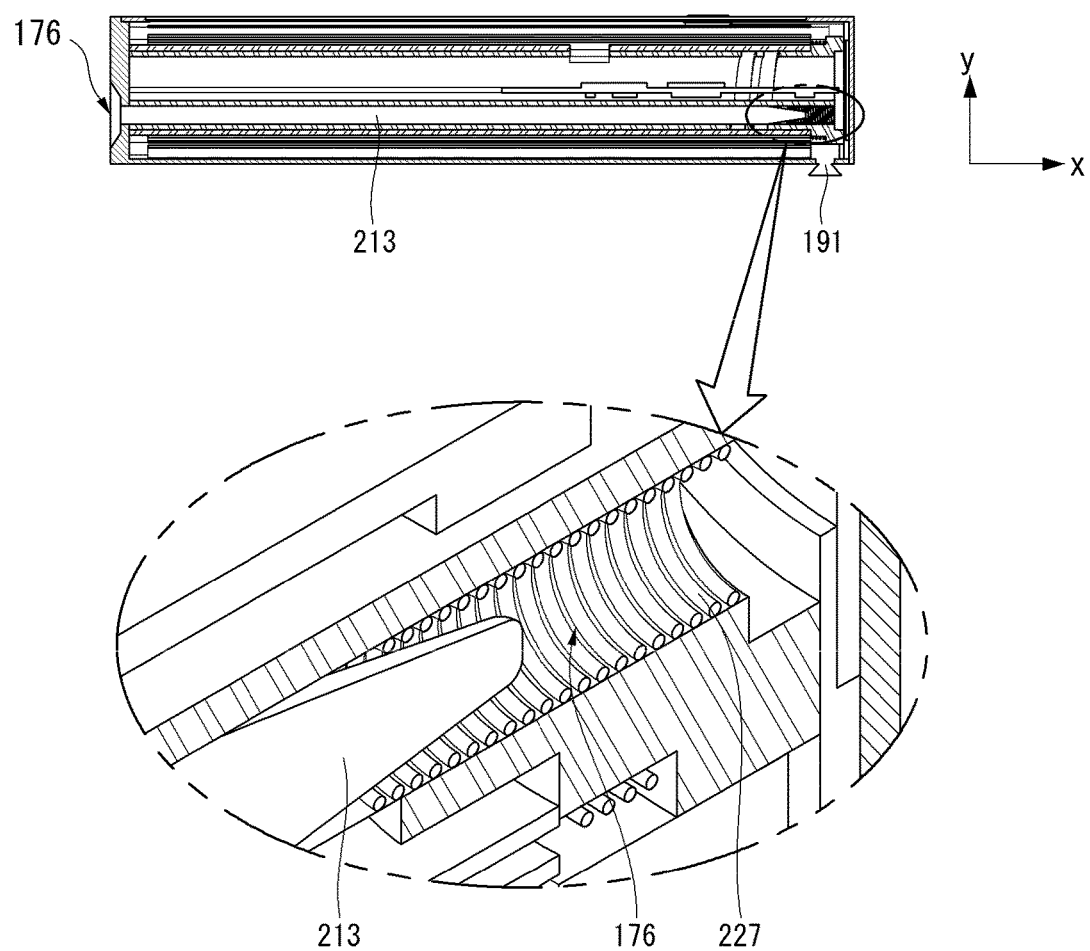

Referring to FIG. 4, a spring 227 may be positioned at a depressed end of the insertion hole 176. Namely, when the touch pen 213 is inserted into the insertion hole 176, the spring 227 may be disposed in a portion of the insertion hole 176 corresponding to a tip of the touch pen 213. The spring 227 may be configured so that the touch pen 213 can be fixed to the inside of the insertion hole 176.

More specifically, when the touch pen 213 is pressed to the inside of the insertion hole 176 and then a pressing force is removed, the touch pen 213 may be fixed to the inside of the insertion hole 176. Afterwards, when the fixed touch pen 213 is again pressed to the inside of the insertion hole 176 and then a pressing force is removed, the touch pen 213 may receive a force from the outside of the insertion hole 176 by an elastic force of the spring 227.

The touch pen 213 may be fixed to the inside of the insertion hole 176 by the spring 227 positioned inside the insertion hole 176 or may receive the force from the outside of the insertion hole 176 by the spring 227. Hence, the user can easily carry the electronic device 100 because the touch pen 213 is usually fixed to the inside of the housing 30.

Figure 5:
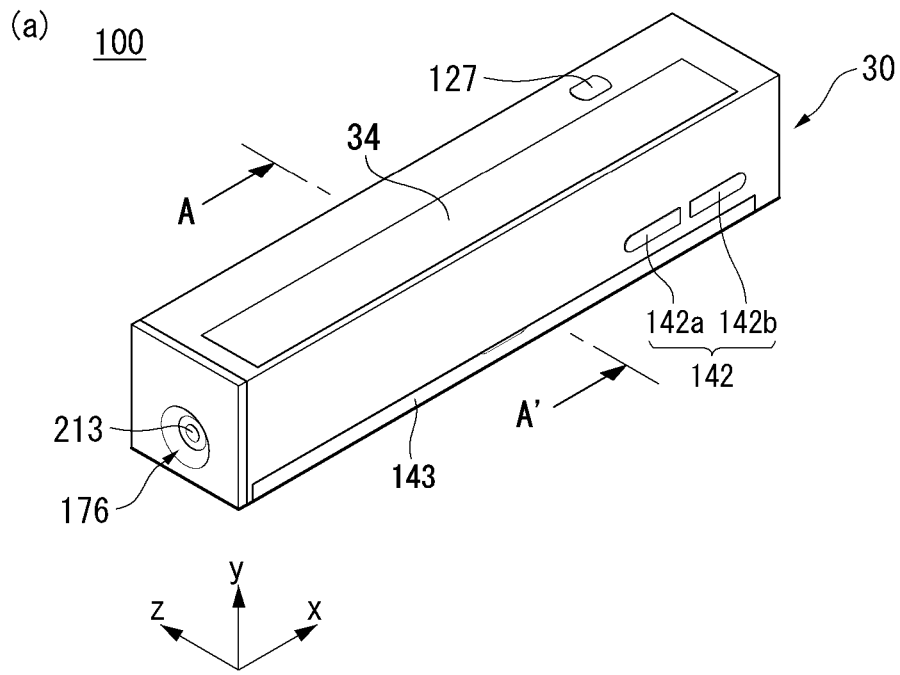
Figure 5:
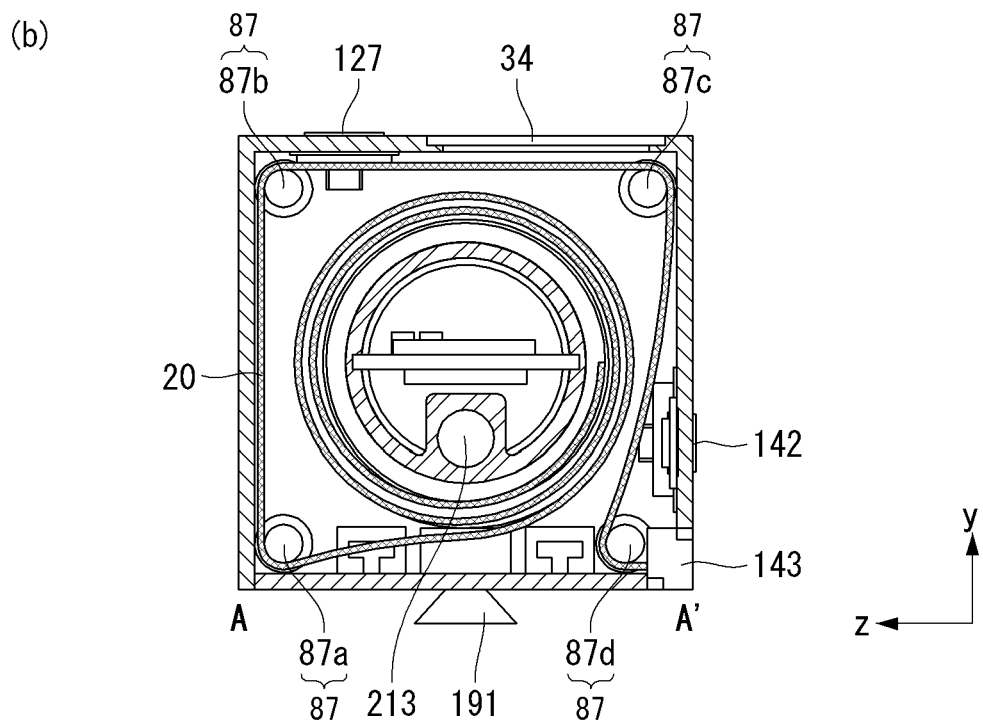

Referring to FIG. 5, a guide roller 87 may be positioned at an edge inside the housing 30. Before the display panel 20 rolled on a panel roller 156 is exposed to the outside, the guide roller 87 may evenly spread the display panel 20.

The guide roller 87 may include first to fourth guide rollers 87a to 87d. The first guide roller 87a may be positioned opposite an entrance of the housing 30, to which the display panel 20 is exposed. The first guide roller 87a of the guide rollers 87a to 87d may be closest to a location, at which the display panel 20 is unrolled from the panel roller 156. The second to fourth guide rollers 87b to 87d may be positioned in the order named in a clockwise direction based on the first guide roller 87a.

The display panel 20 may be adjacent to an inner surface of the housing 30 by the first to fourth guide rollers 87a to 87d. Hence, the display panel 20 may be adjacent to the window 34.

Figure 6:
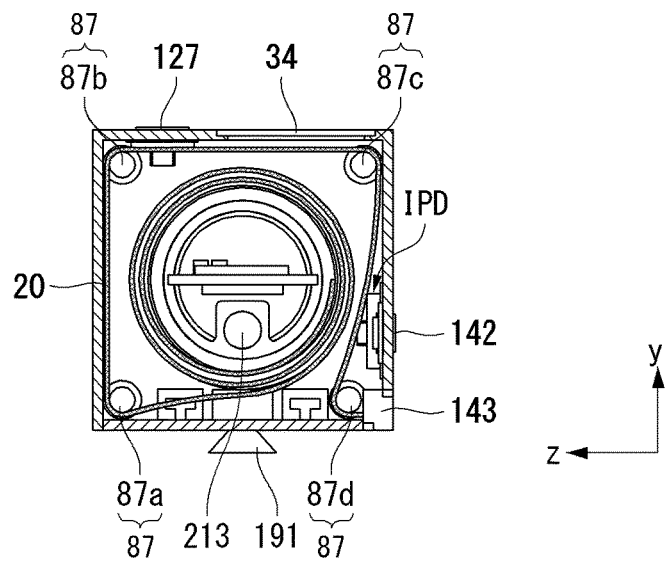
Figure 6:
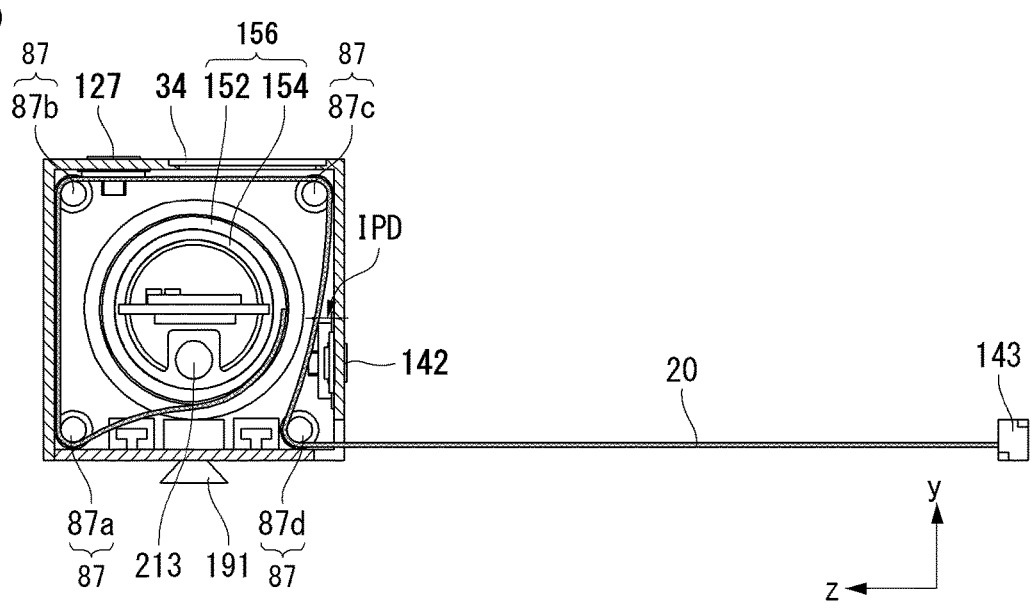

Referring to FIG. 6, the first to third guide rollers 87a to 87c may guide an inner surface of the display panel 20, and the fourth guide roller 87d may guide an outer surface of the display panel 20. Hence, the display panel 20 between the third guide roller 87c and the fourth guide roller 87d may not bend to the inner surface of the housing 30 and may be spaced apart from the housing 30 by a predetermined distance IPD.

Namely, as shown in (a) of FIG. 6, even when the display panel 20 is rolled on the panel roller 156 in the first state in which the display panel 20 is positioned inside the housing 30, at least a portion of the display panel 20 may evenly spread by the first to fourth guide rollers 87a to 87d.

As shown in (b) of FIG. 6, in the second state in which the display panel 20 is exposed to the outside of the housing 30, the display panel 20 may be exposed via the fourth guide roller 87d. Namely, the display panel 20 may be unrolled from the panel roller 156 and may be exposed to the outside after passing through the first to fourth guide rollers 87a to 87d. The display panel 20 may evenly spread while passing through the first to fourth guide rollers 87a to 87d.

Figure 7:
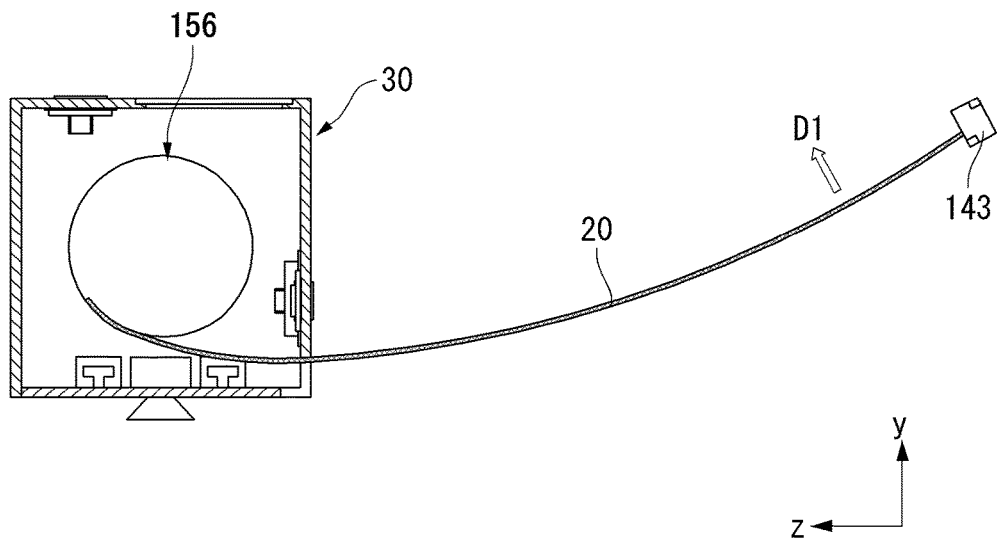
Figure 7:
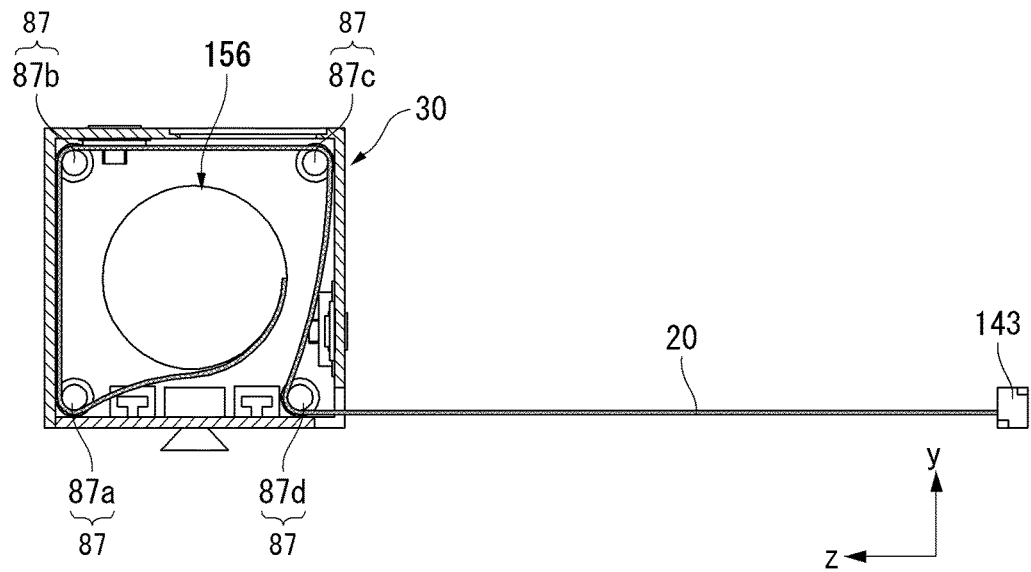

As shown in (a) of FIG. 7, in an electronic device according to a related art, a guide roller may not be positioned inside a housing 30. Hence, a display panel 20 may not evenly spread in a second state. Namely, even when the display panel 20 is unrolled from a panel roller 156, the display panel 20 may try to be rolled on the panel roller 156.

Hence, in the second state, the display panel 20 may be curled in a first direction Dl. The user cannot concentrate on a screen of the display panel 20 because the display panel 20 exposed to the outside of the housing 30 is not flat.

On the other hand, as shown in (b) of FIG. 7, in the electronic device according to the embodiment of the disclosure, the first to fourth guide rollers 87a to 87d may be positioned inside the housing 30. Hence, the display panel 20 may spread while maintaining an even state before being exposed to the outside. Namely, the display panel 20 may spread inside the housing 30 several times by the first to fourth guide rollers 87a to 87d.

Thus, the display panel 20 may not be curled and may evenly spread in the second state. The user can concentrate more on a display screen of the flat display panel 20.

Figure 8:
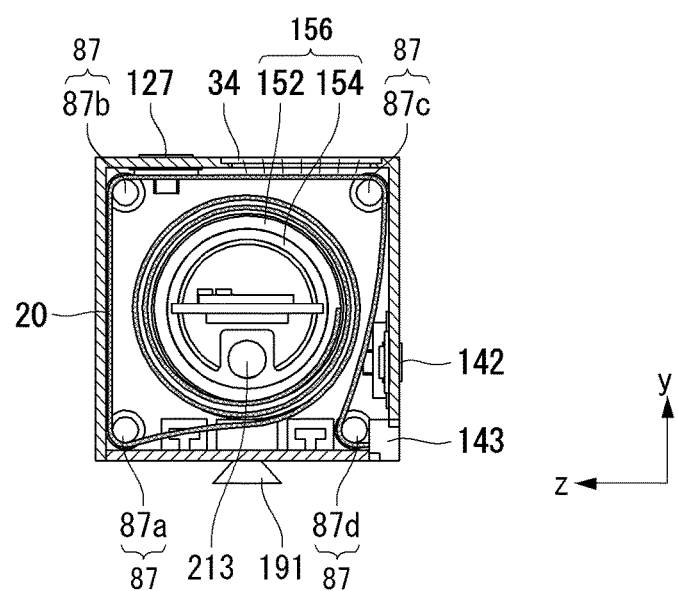
Figure 8:
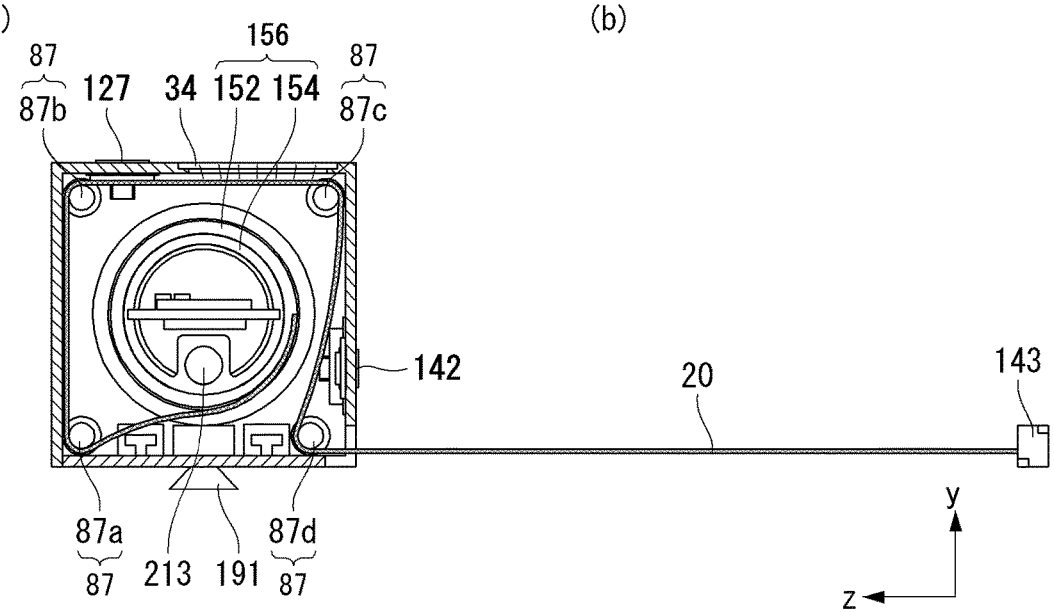

Referring to FIG. 8, when the display panel 20 is positioned inside the housing 30, a display screen may be displayed on a portion of the display panel 20 corresponding to the window 34. Namely, the user may watch the display screen through the window 34 under any circumstances.

When the display panel 20 is changed from the first state to the second state, a portion of the display panel 20 corresponding to the window 34 may be changed. Hence, a portion of the display panel 20, on which the display screen is displayed, may continuously change inside the housing 30. A method of sensing a portion of the display panel 20, on which the display screen is displayed, will be described later.

Even in the second state, the display screen may be displayed on a portion of the display panel 20 corresponding to the window 34. Namely, the display screen may be displayed on both the display panel 20 exposed to the outside of the housing 30 and a portion of the display panel 20 corresponding to the window 34. Difference screens may be displayed on the display panel 20 exposed to the outside of the housing 30 and a portion of the display panel 20 corresponding to the window 34. However, embodiments of the disclosure are not limited thereto. For example, the same screen may be displayed on the display panel 20 exposed to the outside of the housing 30 and a portion of the display panel 20 corresponding to the window 34.

In the electronic device 100 according to the embodiment of the disclosure, the display screen may be displayed on at least a portion of the display panel 20 positioned inside the housing 30. Hence, the user can more easily watch the display screen.

Figure 9:
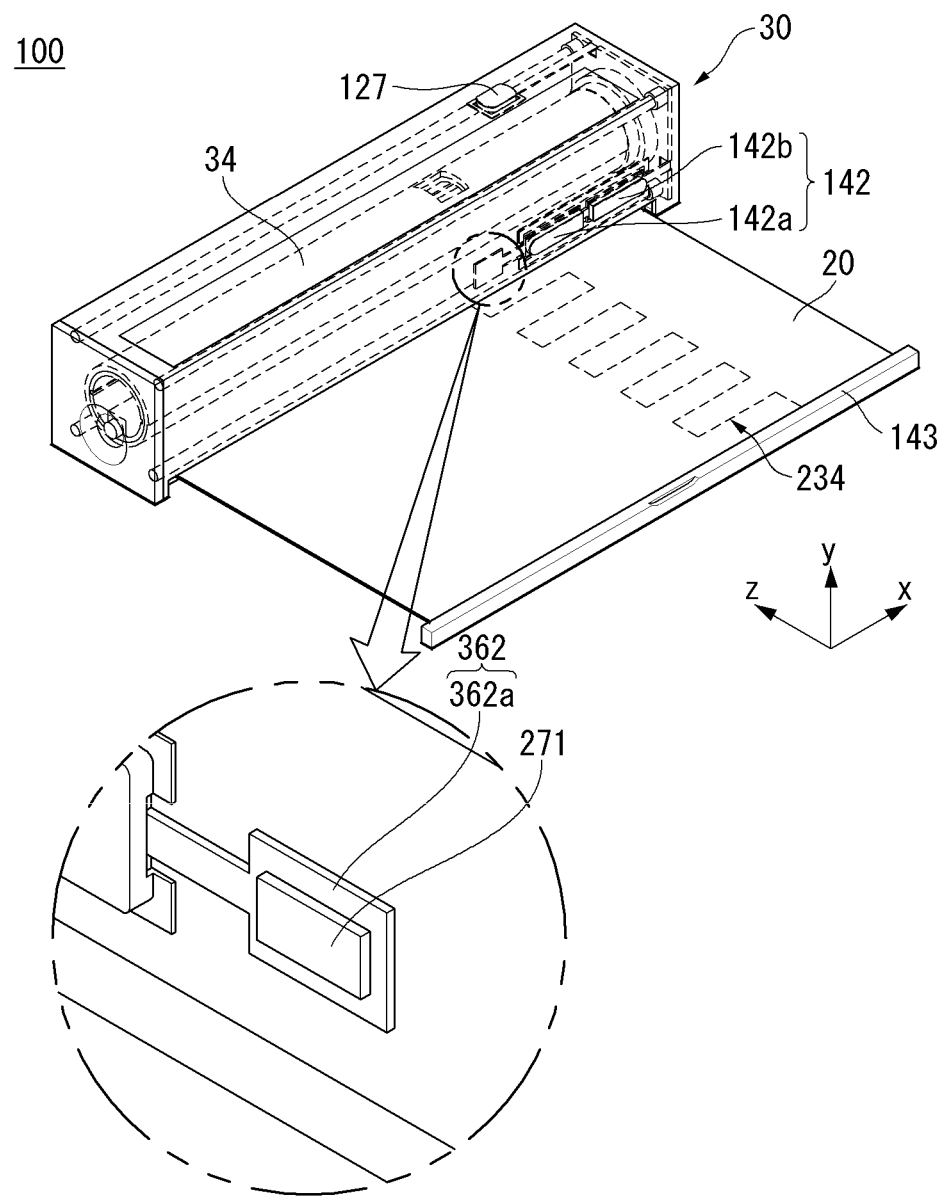

Referring to FIG. 9, a pattern 234 may be displayed on the inside of the display panel 20. The pattern 234 may include a magnetic material. The pattern 234 may have a shape extended from one end to the other end of the display panel 20. Because the pattern 234 is positioned inside the display panel 20, the pattern 234 may not be exposed to the outside. Hence, the user can watch a clear display screen, on which the pattern 234 is not seen.

A hall sensor 271 may be positioned inside a surface of the housing 30, on which the control button 142 is positioned. The hall sensor 271 may be spaced apart from a formation portion of the control button 142. The hall sensor 271 may be positioned on a protrusion 362a of a flexible printed circuit board (FPCB) 362 extended from a back surface of the control button 142.

The electronic device 100 according to the embodiment of the disclosure may include the controller. The controller may generate a control signal. The controller may be configured so that multiple applications for the electronic device 100 and data, commands, etc. for an operation of the electronic device 100 are executed.

The hall sensor 271 may sense a magnetic field of the pattern 234. More specifically, when the display panel 20 is rolled and unrolled, the hall sensor 271 may sense a magnetic field of the pattern 234 passing around the hall sensor 271. When the hall sensor 271 senses a specific magnetic field of the pattern 234, the controller may activate at least a portion of the display panel 20.

Figure 10:
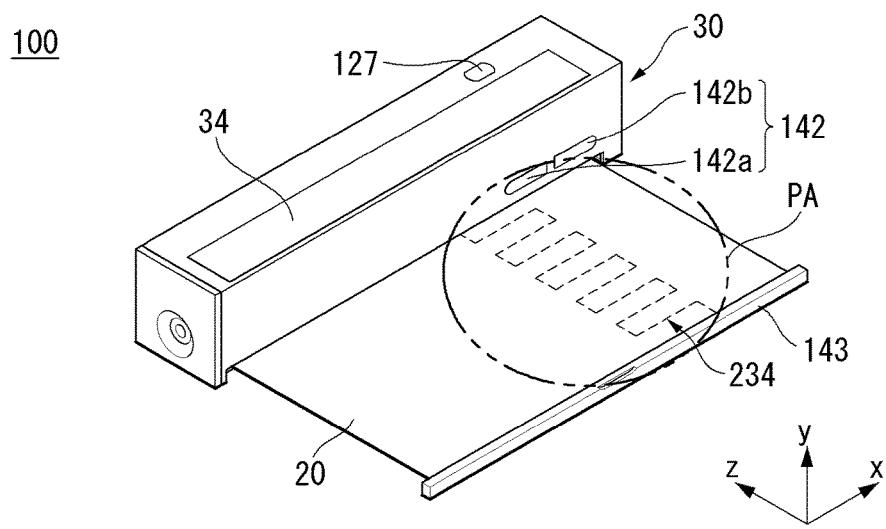
Figure 10:
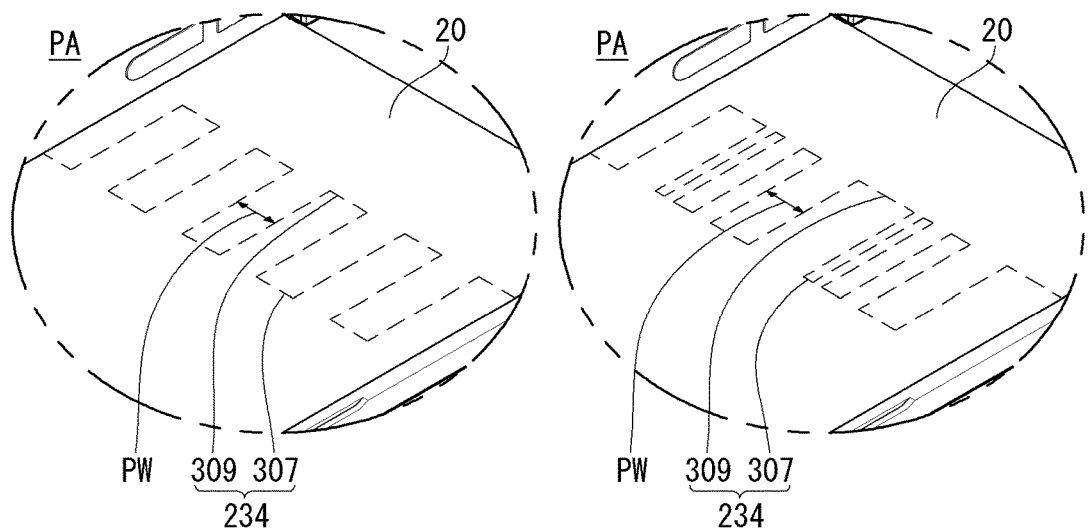

Referring to FIG. 10, the pattern 234 positioned inside the display panel 20 may have various shapes.

As shown in (a) of FIG. 10, the pattern 234 may include valley portions 307 and peak portions 309. The valley portions 307 and the peak portions 309 may be alternately disposed in a third direction.

A hall sensor may be installed near the pattern 234. For instance, the hall sensor may be disposed at a location corresponding to a line connecting the valley portions 307 and the peak portions 309. Hence, the hall sensor may sense a magnetic field or a variance of a magnetic field when the pattern 234 passes by the hall sensor.

Distances PW between the peak portions 309 of the pattern 234 may be uniform. Namely, the peak portions 309 may be disposed at intervals of the predetermined distance PW. Hence, the hall sensor may determine a portion (or a location) of the display panel 20, that will be activated, through the number of lines passing through the hall sensor. Namely, a portion of the display panel 20 to be activated may be determined through the number of magnetic fields sensed by the hall sensor.

On the other hand, as shown in (b) of FIG. 10, distances PW between the peak portions 309 of the pattern 234 may be non-uniform. Namely, the peak portions 309 may be spaced apart from one another by the different distances PW. In this instance, the hall sensor may determine a portion (or a location) of the display panel 20, that will be activated, through distances between lines passing through the hall sensor. Namely, a portion of the display panel 20 to be activated may be determined through time intervals of magnetic fields sensed by the hall sensor.

Figure 11:
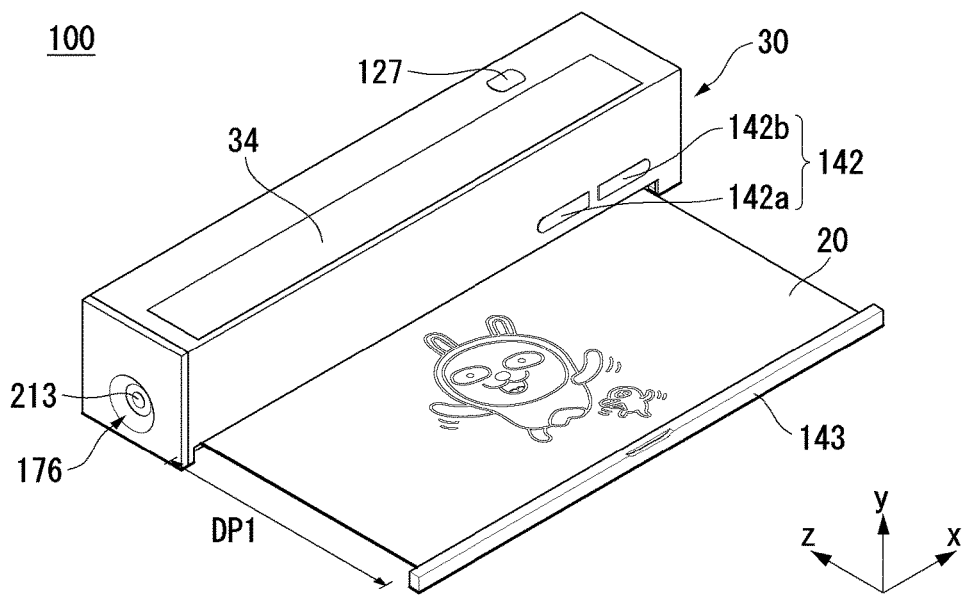
Figure 11:
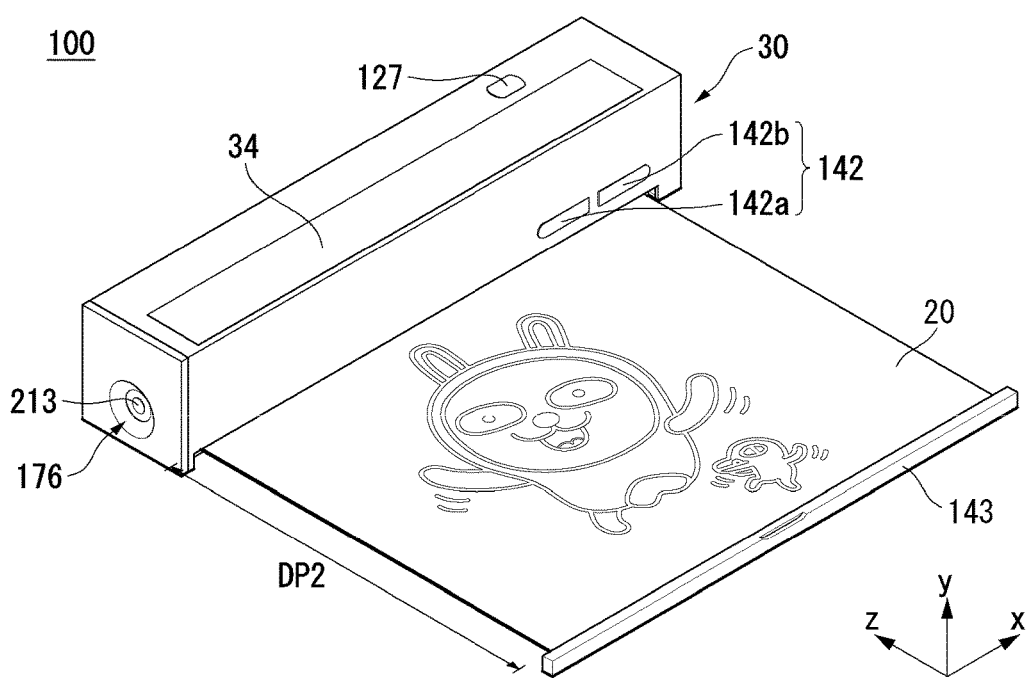

Referring to FIG. 11, the electronic device 100 according to the embodiment of the disclosure may sense a width of a display screen exposed to the outside of the housing 30 by a magnetic field sensed by the hall sensor.

For example, as shown in (a) of FIG. 11, when the display panel 20 is spreading while being changed from the first state to the second state, a width DP1 of the display panel 20 exposed to the outside of the housing 30 in the z-axis direction may be relatively short. In this instance, the controller of the electronic device 100 may adjust an aspect ratio based on the exposed width DP1 of the display panel 20 in the z-axis direction.

Further, as shown in (b) of FIG. 11, when the display panel 20 fully spreads and is in the second state, a width DP2 of the display panel 20 exposed to the outside of the housing 30 in the z-axis direction may be relatively long. In this instance, the controller of the electronic device 100 may adjust an aspect ratio based on the exposed width DP2 of the display panel 20 in the z-axis direction.

The exposed width DP2 of the display panel 20 in the second state may be greater than the exposed width DP1 of the display panel 20 in other state. Hence, a display screen of the display panel 20 in the second state may be larger than a display screen of the display panel 20 in other state.

The electronic device 100 according to the embodiment of the disclosure may change an aspect ratio of the display screen based on the exposed width of the display panel 20. Hence, the user can watch the entire display screen without the screen cutting while the display panel 20 is being rolled and unrolled.

Figure 12:
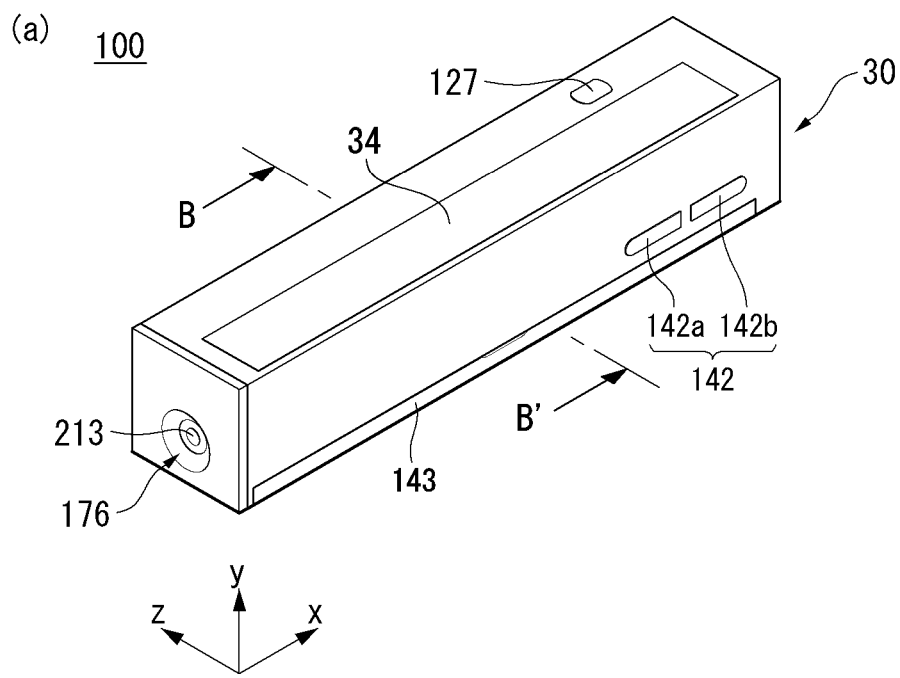
Figure 12:
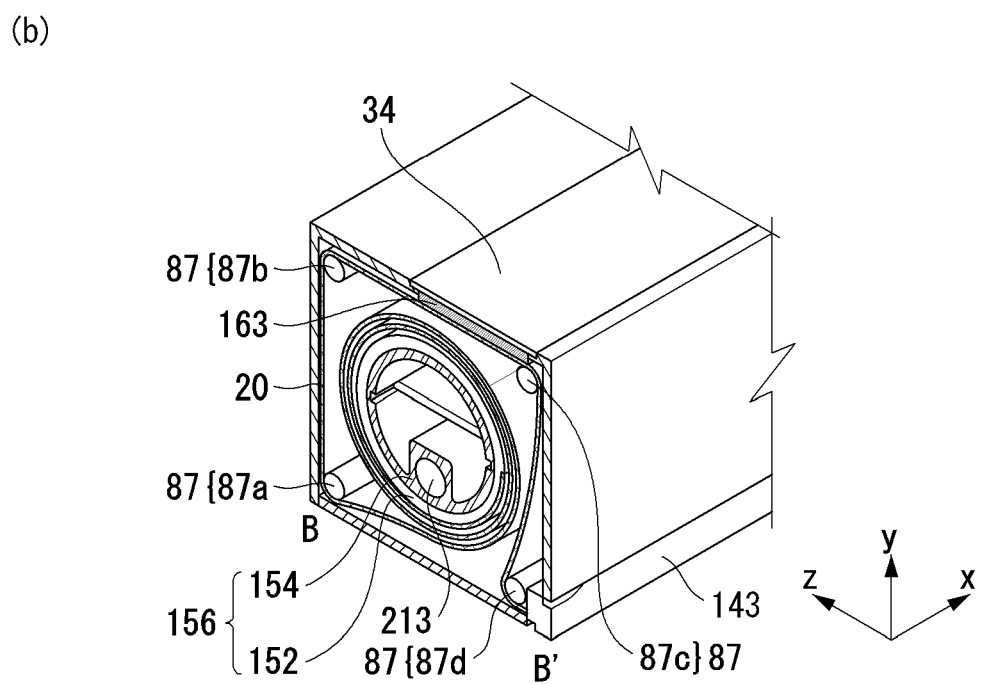

Referring to FIG. 12, the electronic device 100 according to the embodiment of the disclosure may include a sub-display panel 163 positioned inside the window 34. The sub-display panel 163 does not move and may display a screen only through the window 34. Hence, a width of the sub-display panel 163 may be the same as or similar to a width of the window 34.

When the sub-display panel 163 is positioned inside the housing 30, the display panel 20 may be rolled in a counterclockwise direction. Namely, the guide roller 87 may guide the outer surface of the display panel 20, on which the screen is displayed. Because the sub-display panel 163 is separately positioned, the outer surface of the display panel 20 may not face an inner surface of the housing 30.

In this instance, the guide roller 87 may include first to third guide rollers 87a to 87c. Because the display panel 20 is rolled in the counterclockwise direction, a direction of spreading the display panel 20 may not rapidly change at an entrance of the housing 30 as shown in FIG. 12. Hence, the guide roller 87 may not include a fourth guide roller 87d. As a result, a manufacturing process can be simplified, and the manufacturing cost may be reduced.

The electronic device 100 according to the embodiment of the disclosure may include the sub-display panel 163 positioned inside the window 34. Hence, the display panel 20 may not display the screen inside the housing 20. Thus, because the hall sensor does not need to be positioned inside the housing 30, the manufacturing cost may be reduced.

Figure 13:
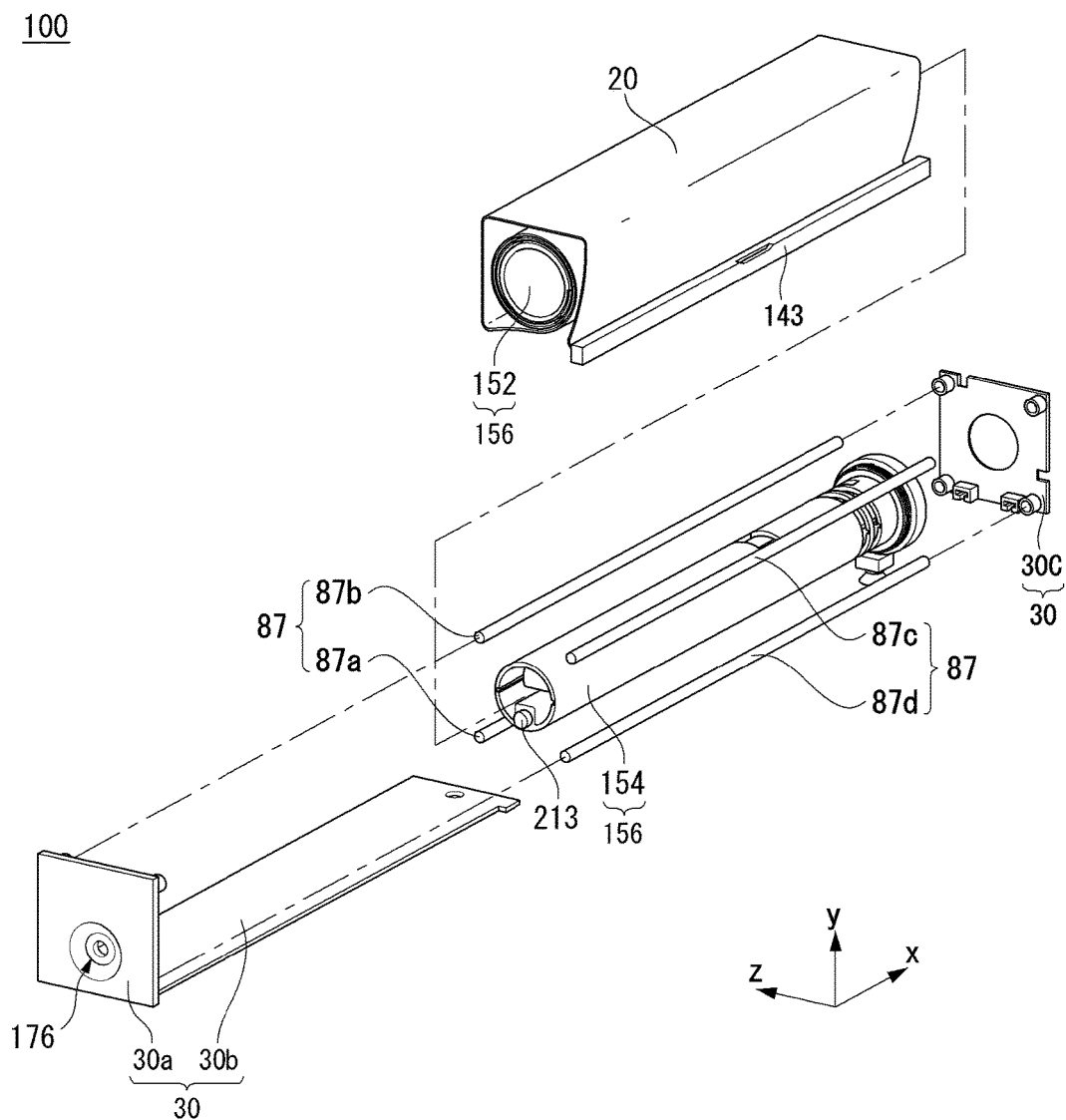

Referring to FIG. 13, the guide roller 87 and the panel roller 156 may be inserted into the inside of the housing 30. More specifically, one end of the guide roller 87 and one end of the panel roller 156 may be fixed to a first surface 30a corresponding to the side of the housing 30. And then, the other end of the guide roller 87 and the other end of the panel roller 156 may be fixed to a third surface 30c opposite the first surface 30a of the housing 30.

The panel roller 156 may include an inner frame 154 and an outer frame 152. The outer frame 152 may have a shape of wrapping the inner frame 154. The inner frame 154 may be fixed to the housing 30 together with the guide roller 87. Various electronic parts may be mounted inside the inner frame 154.

The camera 191 may be positioned at a lower end of the inner frame 154. When the inner frame 154 is fixed to the first surface 30a, the camera 191 may be inserted into an opening positioned in a second surface 30b corresponding to a lower surface of the housing 30.

Figure 14:
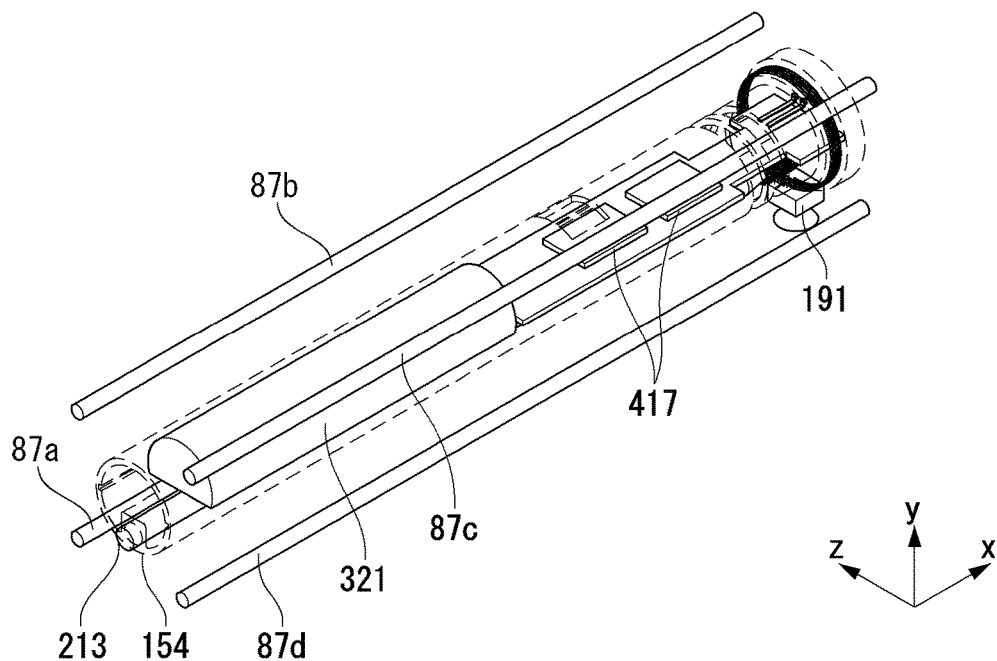
Figure 14:
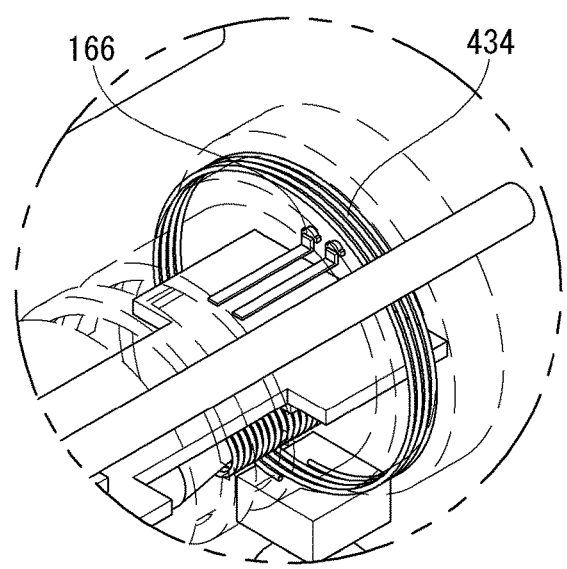

Referring to FIG. 14, the touch pen 213, a battery 321, at least one printed circuit board (PCB) 417, and a contact terminal 166 may be positioned inside the inner frame 154.

The battery 321 may be positioned on a flat surface inside the inner frame 154. The battery 321 may have a semi-circular shape. A flat portion of the battery 321 of the semi-circular shape may contact the flat surface inside the inner frame 154.

At least one PCB 417 may be positioned on the flat surface inside the inner frame 154. At least one PCB 417 may be electrically connected to the battery 321.

A plurality of PCBs 417 may be provided and may be spaced apart from one another. The PCBs 417 may perform different functions. For example, at least one PCB 417 may be a main board. The main board may provide an interface for operating the electronic device. Further, the main board may check and control an operation state of each electronic part included in the electronic device and may optimally make the operation state of each electronic part.

As another example, at least one PCB 417 may be a timing controller board. The timing controller board may transfer an input signal to the display panel. Further, the timing controller board may control an image.

The contact terminal 166 may be positioned on the flat surface inside the inner frame 154. At least a portion of the contact terminal 166 may protrude from the flat surface of the inner frame 154 to the outside. The protrusion of the contact terminal 166 may contact the inner surface of the housing 30. The contact terminal 166 may transfer a signal received from a button on the housing 30 to at least one PCB 417. Hence, although not shown, one end of the contact terminal 166 may be connected to at least one PCB 417. The contact terminal 166 may include a material with high conductivity, so as to smoothly carry the signal.

In the electronic device 100 according to the embodiment of the disclosure, various electronic parts may be mounted inside the inner frame 154 of the panel roller 156. Hence, a space of the electronic device 100 can be saved.

Figure 15:
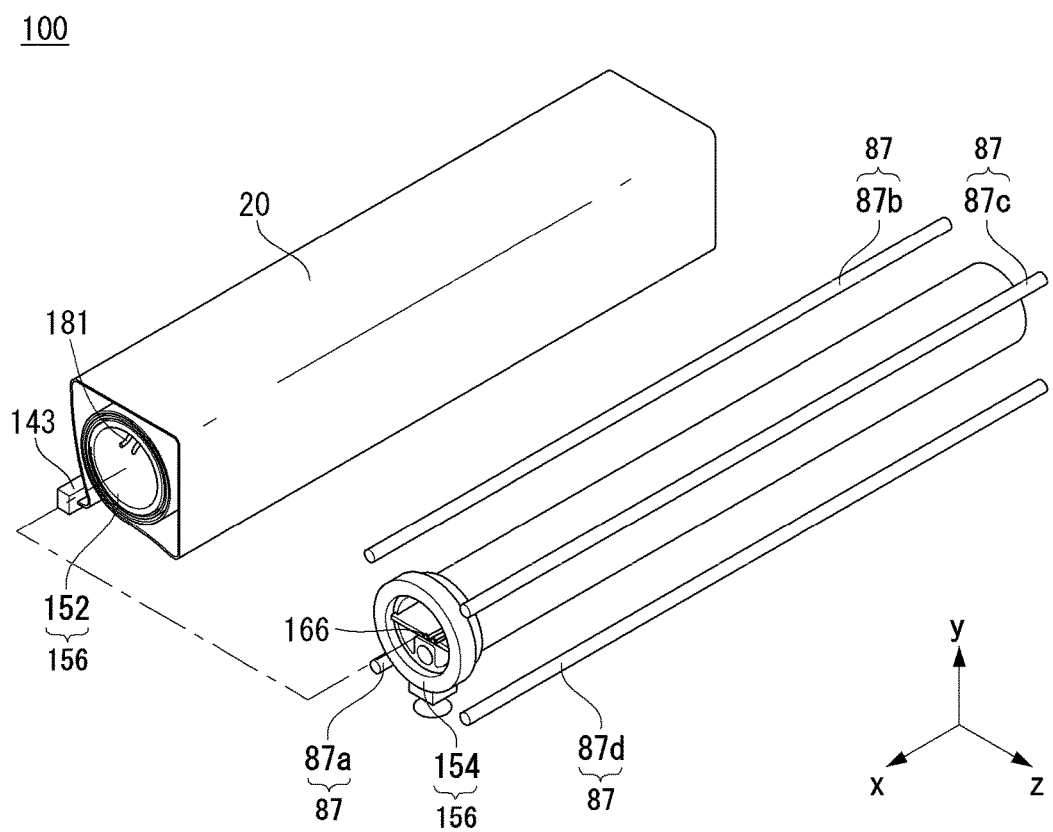

Referring to FIG. 15, the inner frame 154 and the outer frame 152 may be coupled. The outer frame 152 may be inserted between both ends of the inner frame 154 while a middle portion of the inner frame 154 is inserted into the outer frame 152. A diameter of the middle portion of the inner frame 154 may be less than a diameter of the outer frame 152, and a diameter between both ends of the inner frame 154 may be greater than the diameter of the outer frame 152.

Wires 181 may be connected to one end of the outer frame 152. The wires 181 may be used to carry an electrical signal. The wires 181 may be inserted into the side of the inner frame 154 and may be connected to at least one PCB 417. Hence, the wires 181 may be connected to one end of the outer frame 152, at which at least one PCB 417 of the inner frame 154 is positioned.

The display panel 20 may be rolled on the panel roller 156. Hence, the panel roller 156 may rotate. In the electronic device 100 according to the embodiment of the disclosure, the outer frame 152 of the panel roller 156 may rotate, and the inner frame 154 of the panel roller 156 may be fixed. Namely, the outer frame 152 may not be coupled with the inner frame 154. The outer frame 152 may rotate on the inner frame 154.

Because the inner frame 154 does not rotate when the display panel 20 is rolled on the panel roller 156, the electronic parts inside the inner frame 154 may stably operate. Further, the inner frame 154 may be fixed and may be a rotation shaft of the outer frame 152.

Figure 16:
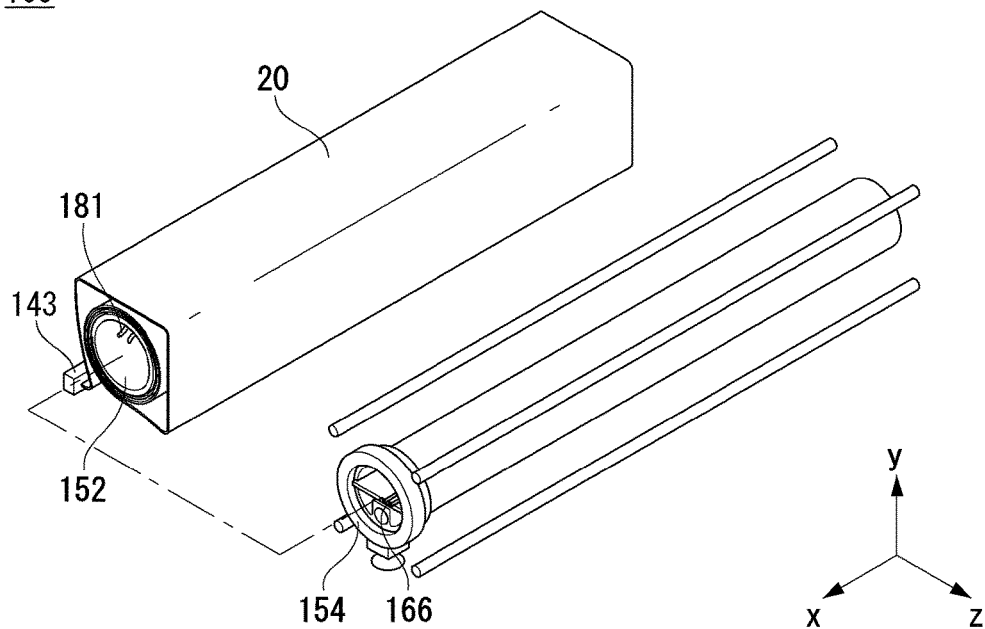
Figure 16:
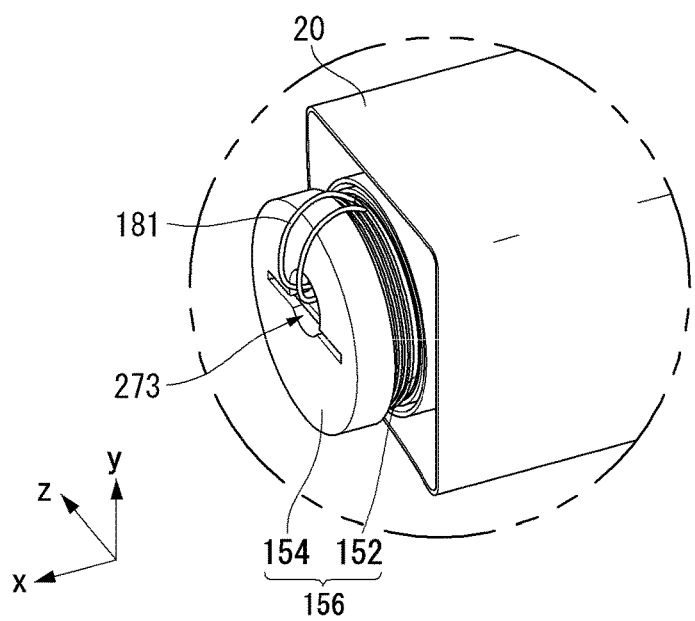

Referring to FIG. 16, a wire hole 273 may be positioned at one side of the inner frame 154. The wire hole 273 may be a portion, in which the wires 181 connected to the outer frame 152 are inserted into the inner frame 154.

When the outer frame 152 rotates, the wire hole 273 can prevent the wires 181 from being tangled. Hence, the wire hole 273 may have a relatively large width or diameter.

A centered portion of the wire hole 273 may have a circular shape or a cylindrical shape, and both wings of the wire hole 273 may be extended from the centered portion of the wire hole 273 in parallel with each other. However, embodiments of the disclosure are not limited thereto. The wire hole 273 may have various shapes as long as the wire hole 273 has a relatively large width or diameter to the extent of preventing the wires 181 from being tangled when the outer frame 152 rotates.

In the electronic device 100 according to the embodiment of the disclosure, the inner frame 154 may include the wire hole 273. Hence, because the wire hole 273 can prevent the wires 181 from being tangled when the outer frame 152 rotates, the disconnection or a problem of the signal transfer is not caused.

Figure 17:
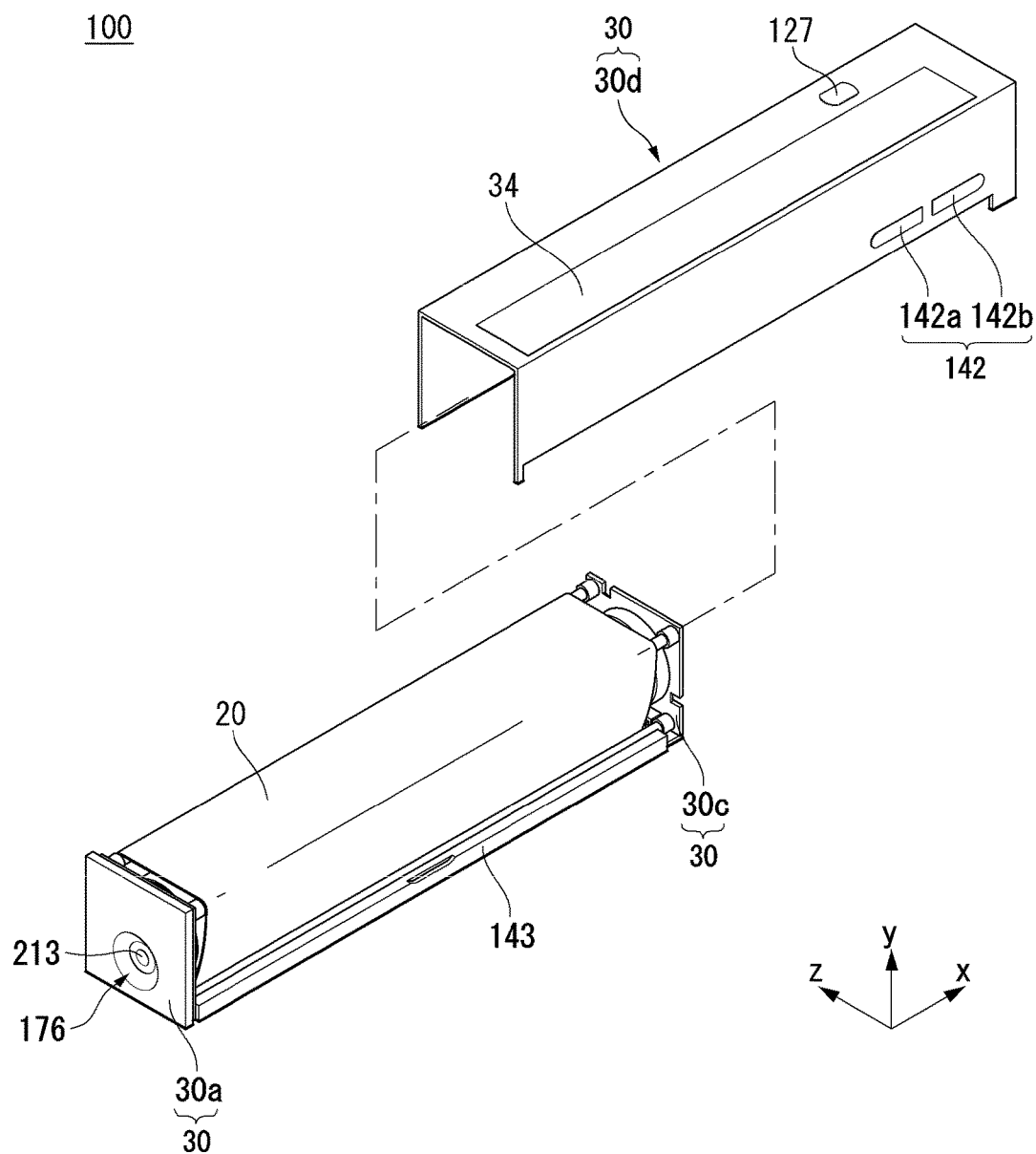

Referring to FIG. 17, a housing case 30d may be positioned on first to third surfaces 30a to 30c of the housing 30 coupled with the panel roller 156. The housing case 30d may shield a surface of the housing 30 except the first to third surfaces 30a to 30c. The housing case 30d may be coupled to the third surface 30c using a latch. However, embodiments of the disclosure are not limited thereto. For example, the housing case 30d may be coupled to the first to third surfaces 30a to 30c using a screw.

The power button 127 and the control button 142 may be positioned on the housing case 30d and may transfer a signal to the electronic device 100. Further, the housing case 30d may additionally shield the third surface 30c. At least one button of the housing case 30d may transfer a signal to the electronic device 100 through the third surface 30c. A method of transferring a signal using at least one button will be described later.

The electronic device 100 according to the embodiment of the disclosure may be assembled by inserting the housing case 30d into the first to third surfaces 30a to 30c of the housing 30, to which a roller is installed. Hence, the user can easily assemble or separate the electronic device 100. As a result, it is easy to replace and repair the electronic device 100.

Figure 18:
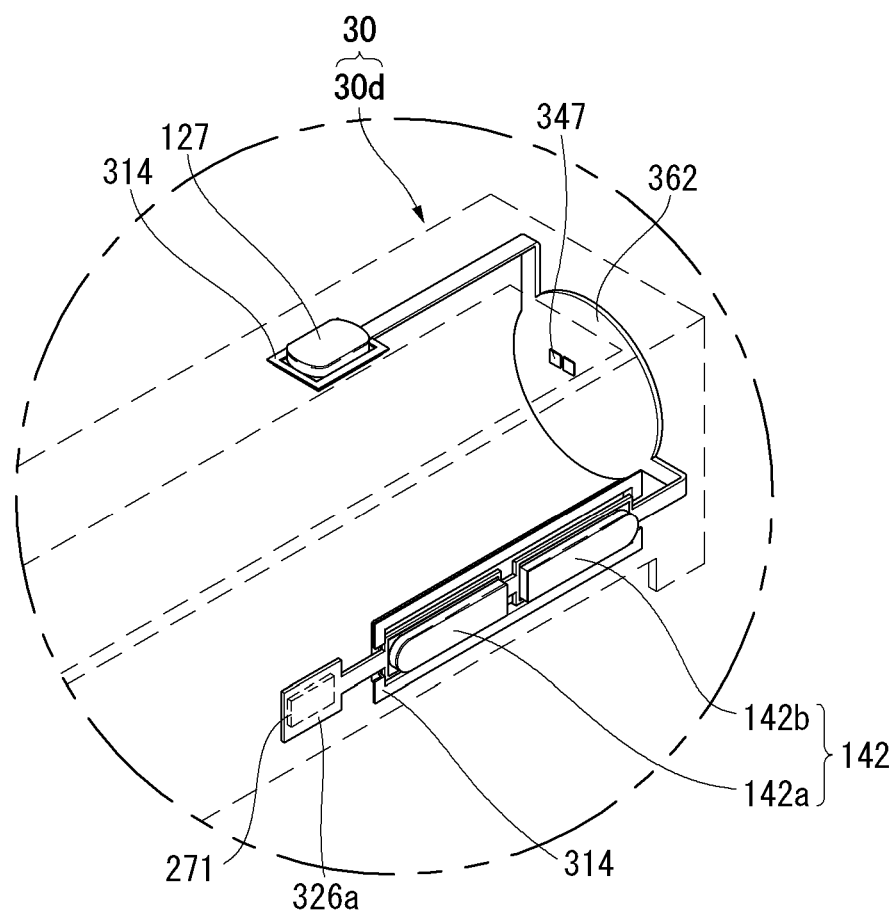

Referring to FIG. 18, the FPCB 362 may be connected to a button so as to carry a signal from the button.

The FPCB 362 may be attached to the inner surface of the housing case 30d. The FPCB 362 may be extended from the power button 127 and the control button 142 to the end portion of the housing case 30d. The FPCB 362 may include a pad 347 on the end portion of the housing case 30d. When the housing case 30d is coupled with the panel roller, the pad 347 may contact the contact terminal and carry an electrical signal. Hence, the pad 347 may include a conductive material. Because the pad 347 contacts the protrusion of the contact terminal, the pad 347 does not protrude from the FPCB 362 and may be flat and mounted on the side of the housing case 30d. However, embodiments of the disclosure are not limited thereto. The pad 347 may protrude from the FPCB 362 so that the pad 347 maintains the contact with the contact terminal.

The FPCB 362 may further include a protrusion 362a extended to the side, and the hall sensor 271 may be positioned on the protrusion 362a.

One surface of the power button 127 and one surface of the control button 142 may be supported by a plate 314. The plate 314 may have a shape of protruding toward the inner surface of the housing case 30d. When the user presses at least one button, a protrusion of the plate 314 may support a pressing force of the user. Namely, the plate 314 can prevent deformation of a portion corresponding to the button of the housing case 30d. The plate 314 may include a stainless material. Hence, corrosion and deformation of the plate 314 can be prevented.

Figure 19:
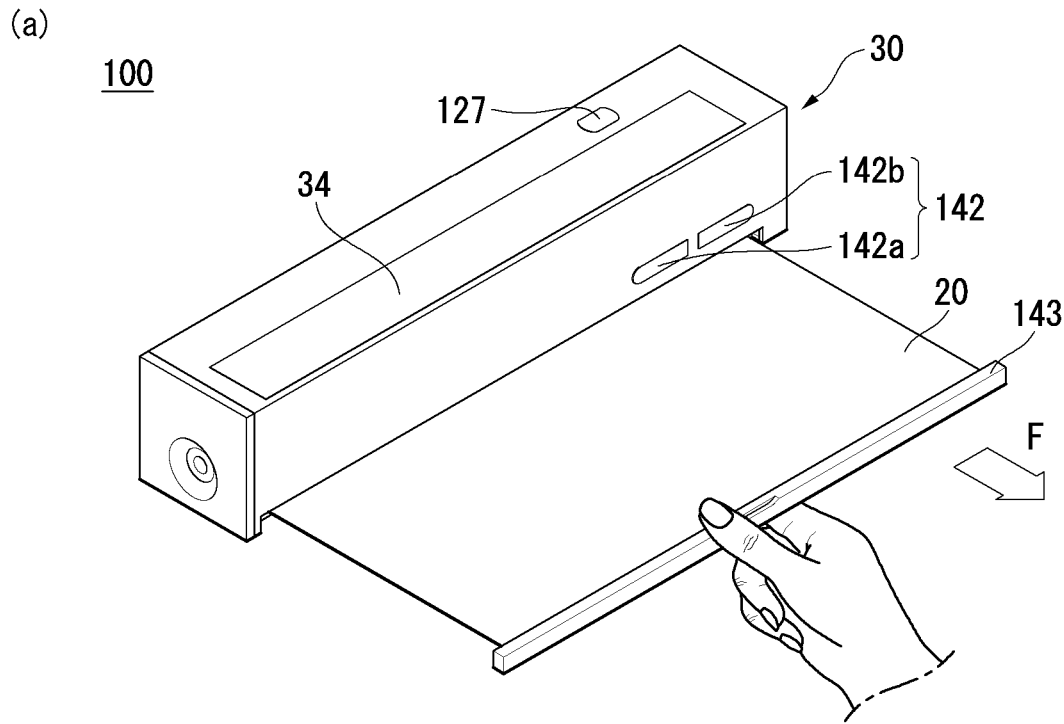
Figure 19:
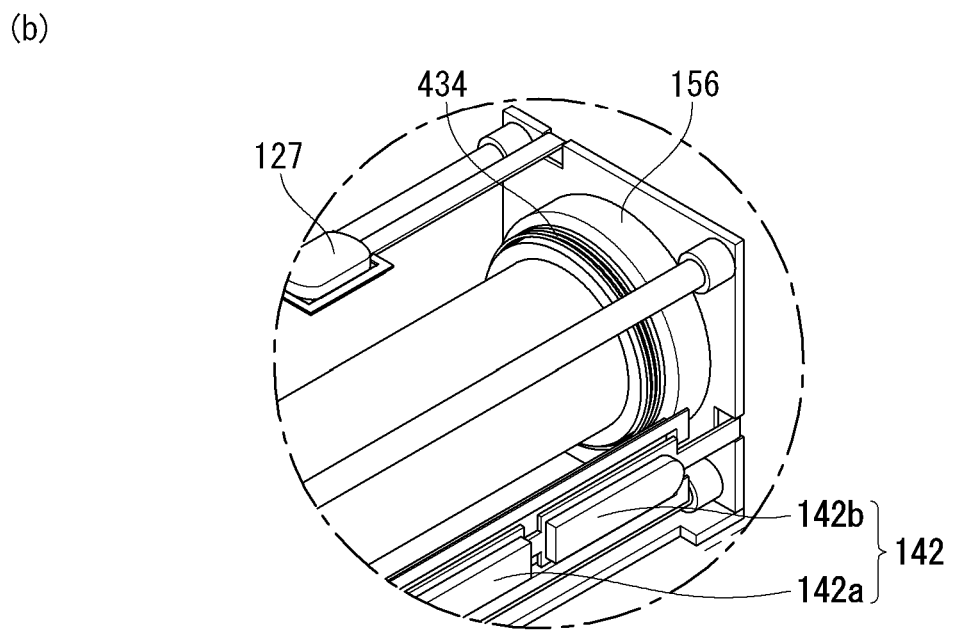

Referring to FIG. 19, the user may pull out the knob 143 using an external force F and may change the electronic device 100 in the second state, in which the display panel 20 is exposed to the outside of the housing 20.

A wind spring 434 may be positioned on one side of the panel roller 156. The wind spring 434 may apply a force in a direction of rolling the display panel 20 on the panel roller 156. For example, the wind spring 434 may apply the force so that the panel roller 156 rotates in a clockwise direction. Hence, when the external force F applied by the user is greater than the force of the wind spring 434 for rotating the panel roller 156, the display panel 20 may be unrolled from the panel roller 156.

Further, the wind spring 434 may fix the panel roller 156 so that the display panel 20 is in the second state. More specifically, when the user pulls the display panel 20 to the maximum and then removes the force, the panel roller 156 may not rotate and may be fixed.

Afterwards, when the user again pulls the fixed display panel 20 and then removes the force, the wind spring 434 may apply the force to rotate the panel roller 156. Hence, the display panel 20 may be more strongly rolled on the panel roller 156.

In the electronic device 100 according to the embodiment of the disclosure, the wind spring 434 may cause the panel roller 156 to be fixed in the second state and cause the display panel 20 to rapidly change from the second state to the first state. Hence, the user can change more easily the state of the display panel 20.

Figure 20:
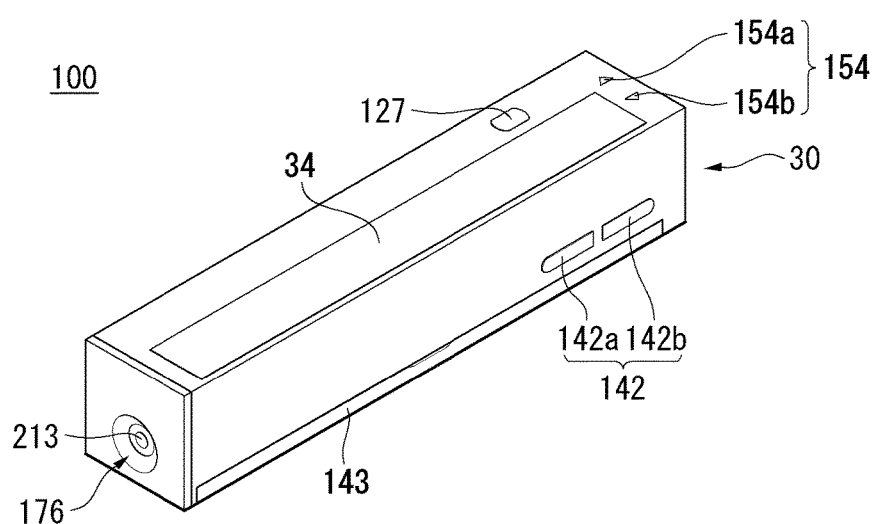
Figure 20:
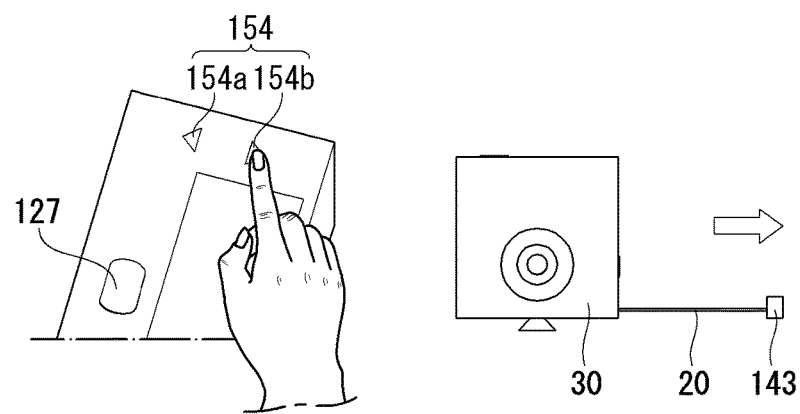
Figure 20:
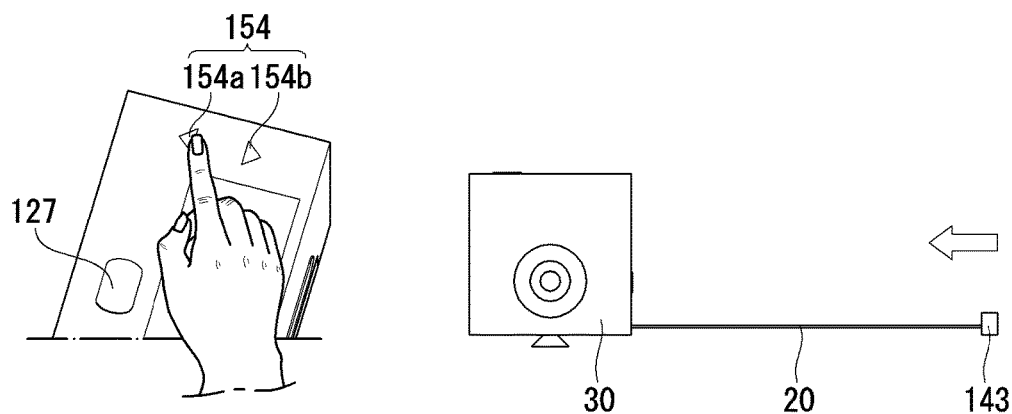

As shown in (a) of FIG. 20, a rolling button 154 may be positioned on one side of the upper surface of the housing 30. The rolling button 154 may be spaced apart from the power button 127 or the window 34.

The rolling button 154 may include first and second rolling buttons 154a and 154b. The first and second rolling buttons 154a and 154b may be spaced apart from each other and may be positioned opposite each other. The first and second rolling buttons 154a and 154b may function to rotate the panel roller 156 so that the display panel 20 is rolled on and unrolled from the panel roller 156.

For example, as shown in (b) of FIG. 20, when the user touches or presses the second rolling button 154b, the display panel 20 may be unrolled from the panel roller 156.

Namely, when the user touches or presses the second rolling button 154b, the display panel 20 may spread toward the outside of the housing 30.

On the contrary, as shown in (c) of FIG. 20, when the user touches or presses the first rolling button 154a, the display panel 20 may be rolled on the panel roller 156. Namely, when the user touches or presses the first rolling button 154a, the display panel 20 may be inserted into the inside of the housing 30.

The electronic device 100 according to the embodiment of the disclosure may roll or unroll the display panel 20 using the first and second rolling buttons 154a and 154b. Hence, the user can easily roll or unroll the display panel 20 without using the force.

FIGS. 21 to 27 illustrate configuration of an electronic device according to another embodiment of the disclosure.

Figure 21:
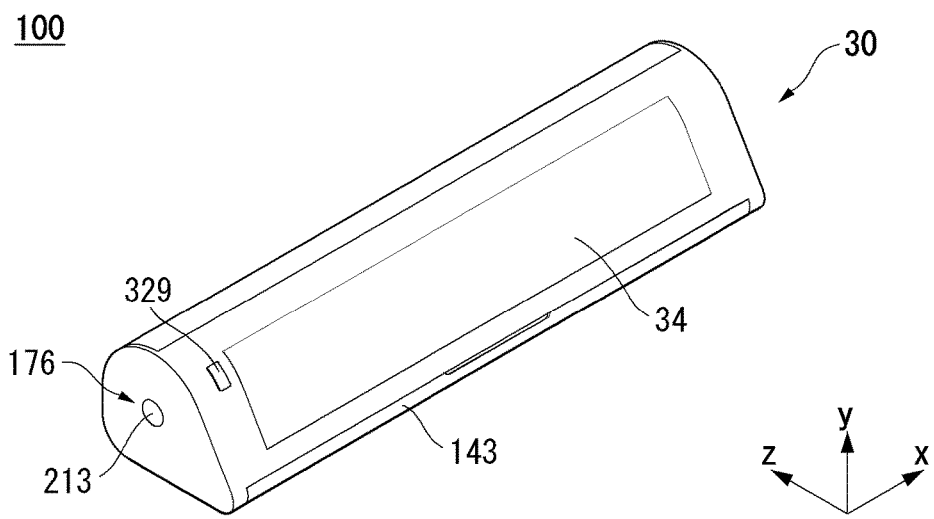
FIGS. 21 to 27 illustrate configuration of an electronic device according to another embodiment of the disclosure.
Figure 21:
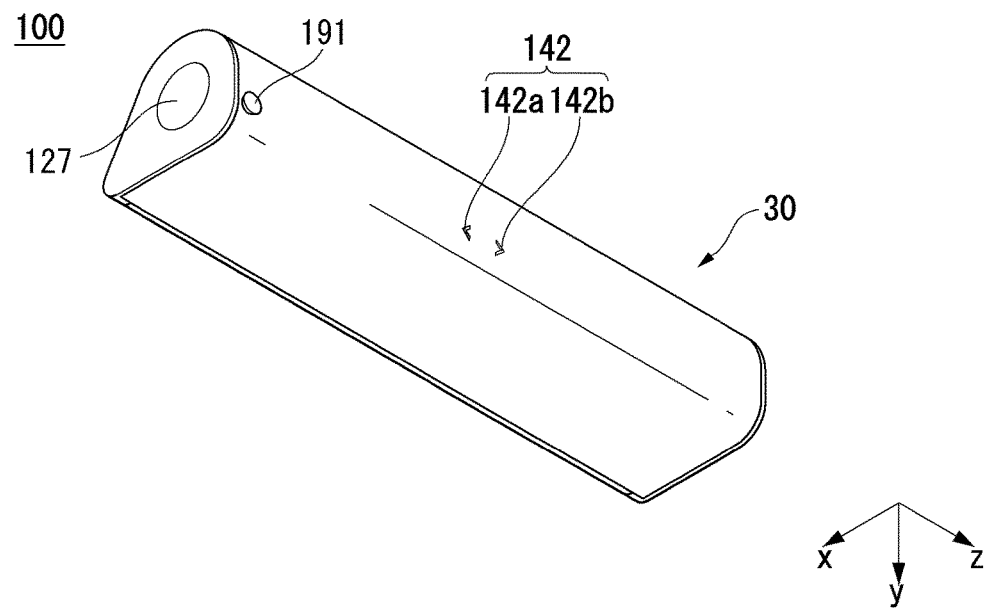

Referring to FIG. 21, an electronic device 100 according to an embodiment of the disclosure may include a housing 30. The housing 30 does not have a cuboid shape, and may have a shape, in which at least one surface of the housing 30 is flat, and a portion symmetrical to the flat surface is a curved surface. In this instance, because an appearance of the electronic device 100 has not a straight line shape but a curved line shape, the user may feel the appearance of the electronic device 100 to be neater.

Because at least one surface of the housing 30 is flat, it may be convenient to place the housing 30 on the floor. Further, because a surface opposite the flat surface of the housing 30 is a curved surface, the user can easily carry the electronic device 100 with his/her hand.

A window 34 may be positioned on a surface connected to the flat surface of the housing 30. A portion of the housing 30 corresponding to the window 34 may be flat. Hence, the user can concentrate more on a screen displayed on the window 34.

A home button 329 may be positioned on one side of the window 34. The home button 329 and the window 34 may be positioned on the same surface to be spaced apart from each other. When the user touches or presses the home button 329, a controller of the electronic device 100 may convert a display screen into a home screen. Namely, when the user touches or presses the home button 329, the controller may end an application, that is being executed, and may return to the home screen.

A knob 143 may be formed at a location where the flat surface of the housing 20 and a formation surface of the window 34 are connected. Further, a camera 191 and a control button 142 may be positioned on the surface of the housing 20 opposite the formation surface of the window 34. Because the control button 142 is positioned opposite the window 34 and the knob 143, the user may easily touch or press the control button 142 while watching a screen displayed on the window 34 or a display panel 20 (see FIG. 22). Functions and structures of the window 34, the control button 142, the knob 143, and the camera 191 shown in FIG. 21 may be substantially the same as those illustrated in FIGS. 1 to 20.

In the electronic device 100 according to the embodiment of the disclosure, at least one surface of the housing 30 may be the flat surface, and another surface of the housing 30 may be the curved surface. Hence, the user can easily place the electronic device 100 on the floor and also easily carry the electronic device 100.

Figure 22:
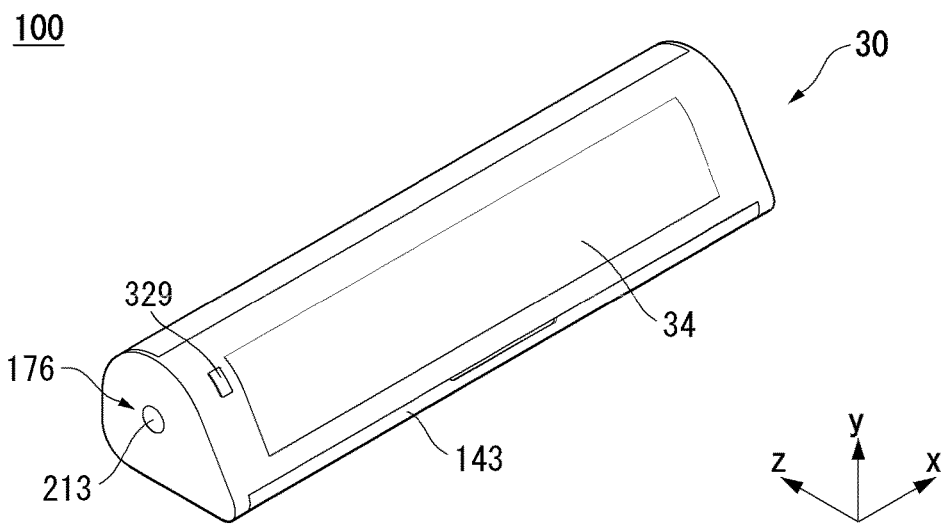
Figure 22:
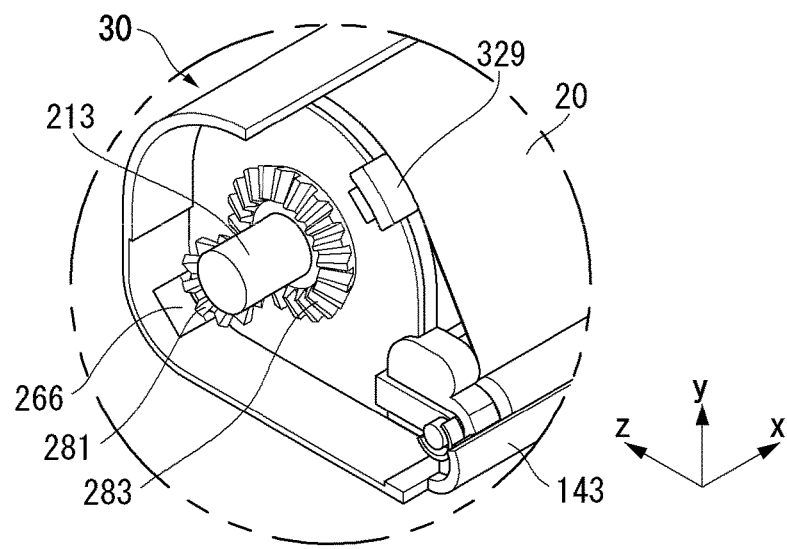

Referring to FIG. 22, a motor assembly may be positioned on one side inside the housing 30. The motor assembly may rotate a panel roller 156, so that the display panel 20 is rolled on and unrolled from the panel roller 156. The motor assembly may include a motor 266, a pinion gear 281, and a ring gear 283.

The motor 266 may be positioned on one side inside the housing 30. The motor 266 may receive an electrical signal and convert the electrical signal into a physical force. The motor 266 may transfer a rotational force to the pinion gear 281.

The pinion gear 281 may transfer the rotational force to a ring gear 283. A rotational speed of the ring gear 283 may be smaller than a rotational speed of the pinion gear 281. The pinion gear 281 may have a sawtooth shape. When the motor 266 rotates in a first direction, the pinion gear 281 may rotate in the first direction at the same time as the motor 266. Further, when the motor 266 rotates in a second direction, the pinion gear 281 may rotate in the second direction at the same time as the motor 266.

The ring gear 283 may have a ring shape. An outer periphery of the ring gear 283 may be geared in the pinion gear 281. The ring gear 283 may have a sawtooth shape, in which the outer periphery of the ring gear 283 is engaged with the pinion gear 281. The ring gear 283 may receive the rotational force from the pinion gear 281 and rotate while having a rotational axis different from a rotational axis of the pinion gear 281.

When the ring gear 283 rotates, the panel roller 156 may rotate at the same time as the ring gear 283. Namely, the ring gear 283 and the panel roller 156 may have the same rotation shaft. Hence, the display panel 20 may be rolled or unrolled as the ring gear 283 rotates.

The electronic device 100 according to the embodiment of the disclosure may drive the panel roller 156 by the pinion gear 281 and the ring gear 283. Hence, when the panel roller 156 is driven, a small noise may be generated, and the display panel 20 may be smoothly rolled and unrolled.

Figure 23:
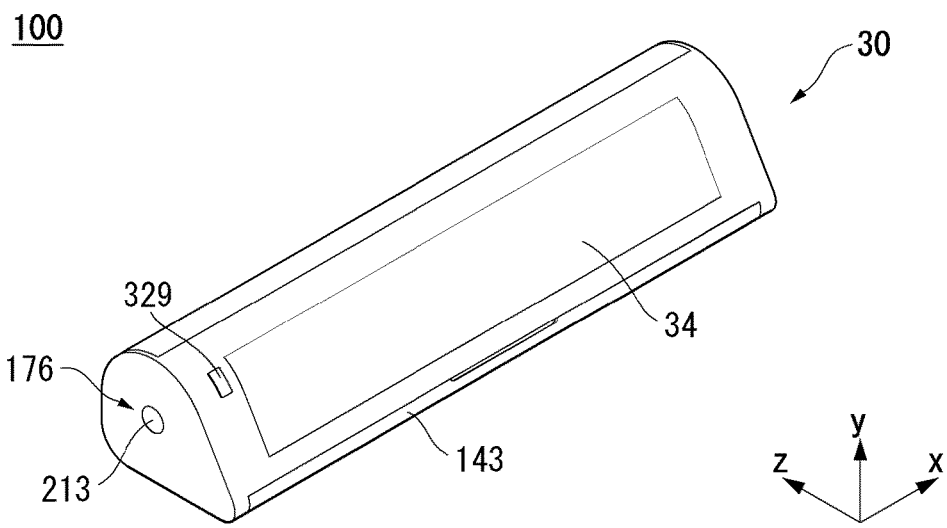
Figure 23:
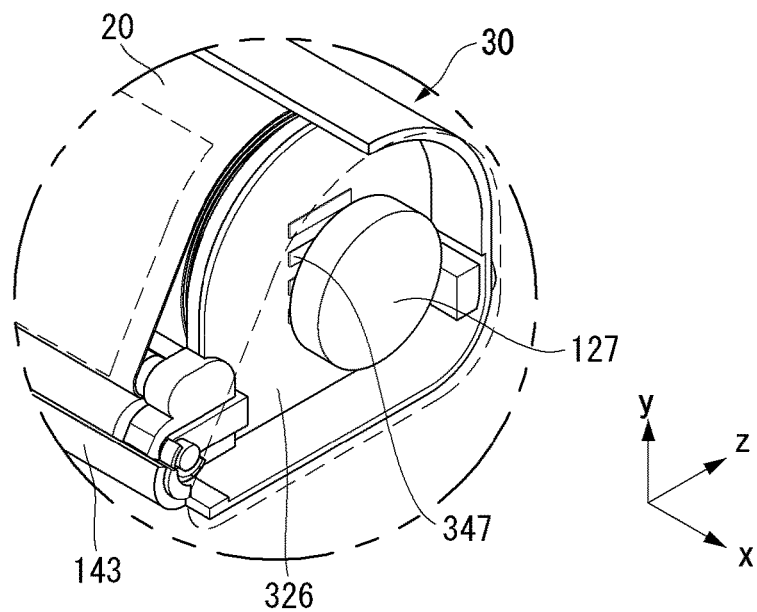

Referring to FIG. 23, a power button 127 may be positioned on the other side of the housing 30. The power button 127 may have a disk shape extended toward the z-axis. The power button 127 may contact a pad 347 on a FPCB 326 spaced apart from one side of the panel roller 156. The pad 347 may contact the power button 127 and carry the electrical signal through the FPCB 326.

An insertion hole 176, into which a touch pen 213 is inserted, may be positioned in the housing 300. The insertion hole 176 may have a shape of digging in the housing 300. Although not shown, the insertion hole 176 may be overlapped with the rotational axis of the panel roller 156.

In the electronic device 100 according to the embodiment of the disclosure, the insertion hole 176 may be positioned in the center of the rotation shaft of the panel roller 156. The insertion hole 176 may not be a barrier to the rotation of the panel roller 156.

Figure 24:
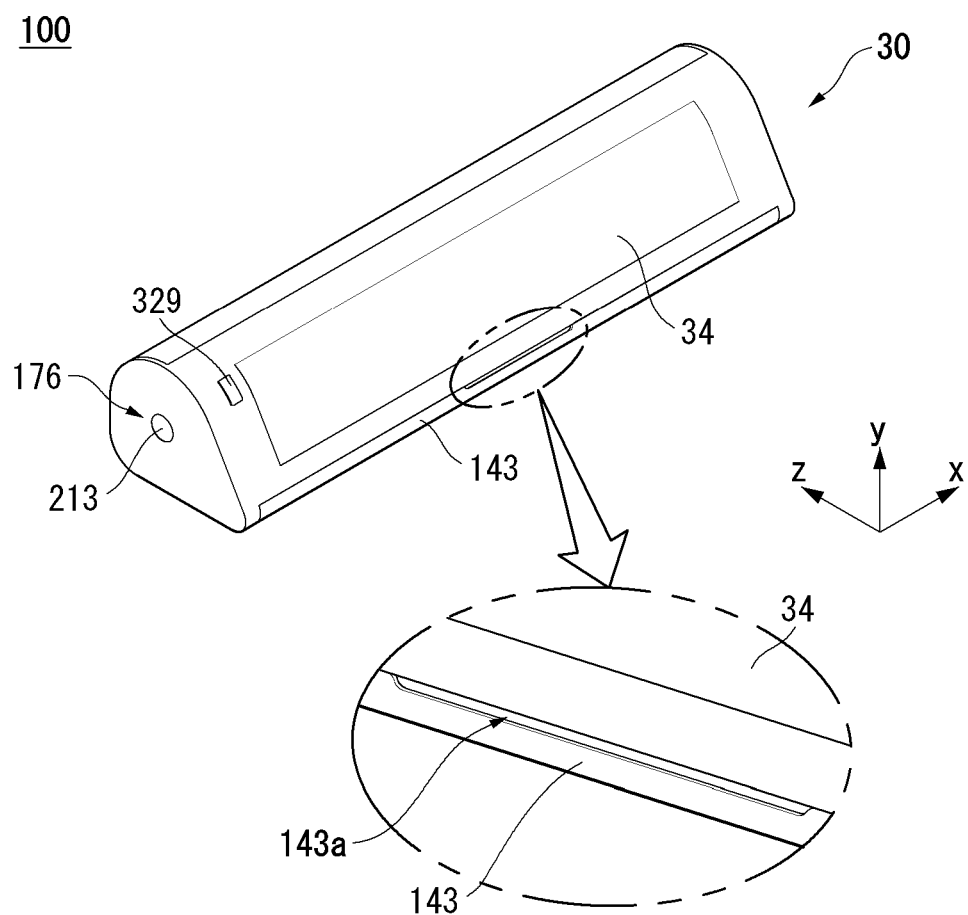

Referring to FIG. 24, the knob 143 may include a groove 143a positioned in the center of the knob 143 in the x-axis direction. The groove 143a may be depressed more inward than other portion of the knob 143. A depth of the groove 143a in the y-axis direction may be shorter than a length of the knob 143 in the y-axis direction. Hence, the user can insert his/her fingers into the groove 143a and can easily pull out the knob 143.

FIG. 24 illustrates that the groove 143a is positioned in the center of the knob 143 in the x-axis direction. However, embodiments of the disclosure are not limited thereto. For example, the groove 143a may be positioned throughout the knob 143 in the x-axis direction. In this instance, the user can insert his/her fingers into the groove 143a in any direction and can easily pull out the knob 143.

Figure 25:
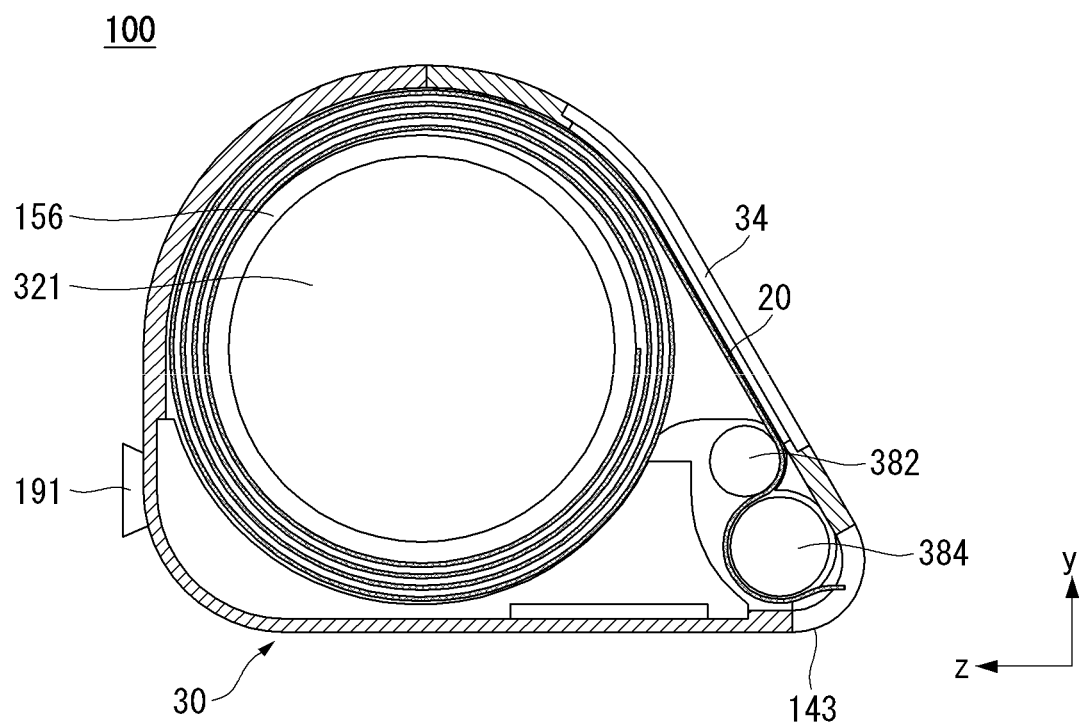

Referring to FIG. 25, a flat roller 382 and a curling roller 384 may be positioned at an entrance of the display panel 20 inside the housing 30. The flat roller 382 may be positioned inside an end of the window 34. Namely, the flat roller 382 may be disposed at a location at which the window 34 of the housing 30 ends.

The flat roller 382 may be spaced apart from the window 34 by a very short distance. Hence, the display panel 20 guided by the flat roller 382 may be very close to the window 34. A screen displayed on the window 34 may be evenly provided by the flat roller 382. Thus, the user may concentrate more on the screen displayed on the window 34.

The flat roller 382 may guide the display panel 20 so that the display panel 20 maintains a flat shape. Hence, a curling phenomenon of the display panel 20 may be reduced.

The curling roller 384 may be positioned adjacent to the flat roller 382. The curling roller 384 may be spaced apart from the flat roller 382 by a thickness of the display panel 20. The curling roller 384 may guide a surface opposite a surface of the display panel 20 the flat roller 382 guides. For example, when the flat roller 382 guides an inner surface of the display panel 20, the curling roller 384 may guide an outer surface of the display panel 20. Because the flat roller 382 and the curling roller 384 respectively guide the opposite surfaces of the display panel 20, the curling phenomenon when the two rollers are used can be further reduced compared to the curling when only one roller is used.

The curling roller 384 may have a diameter greater than a diameter of the flat roller 382, so as to further prevent the curling phenomenon. However, embodiments of the disclosure are not limited thereto. For example, the diameter of the curling roller 384 may be equal to or less than the diameter of the flat roller 382.

Figure 26:
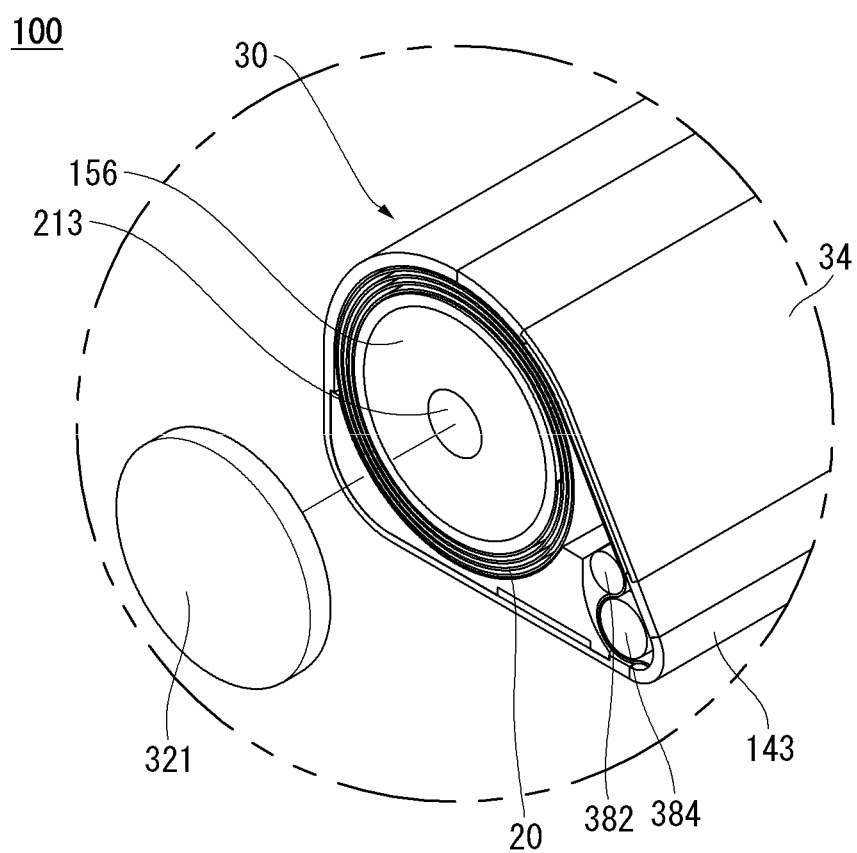

Referring to FIG. 26, a battery 321 may be mounted on the other side inside the housing 30. More specifically, the battery 321 may be mounted at the other end of the panel roller 156. The battery 321 may be coupled with the panel roller 156 and may shield the insertion hole 176 and the touch pen 213.

As described above, because an inner frame of the electronic device 100 according to the embodiment of the disclosure does not rotate, the battery 321 may be stably mounted.

In the electronic device 100 according to the embodiment of the disclosure, the battery 321 may shield the insertion hole 176 and the touch pen 213. Hence, the touch pen 213 may not be easily detached from the other side of the panel roller 156.

Figure 27:
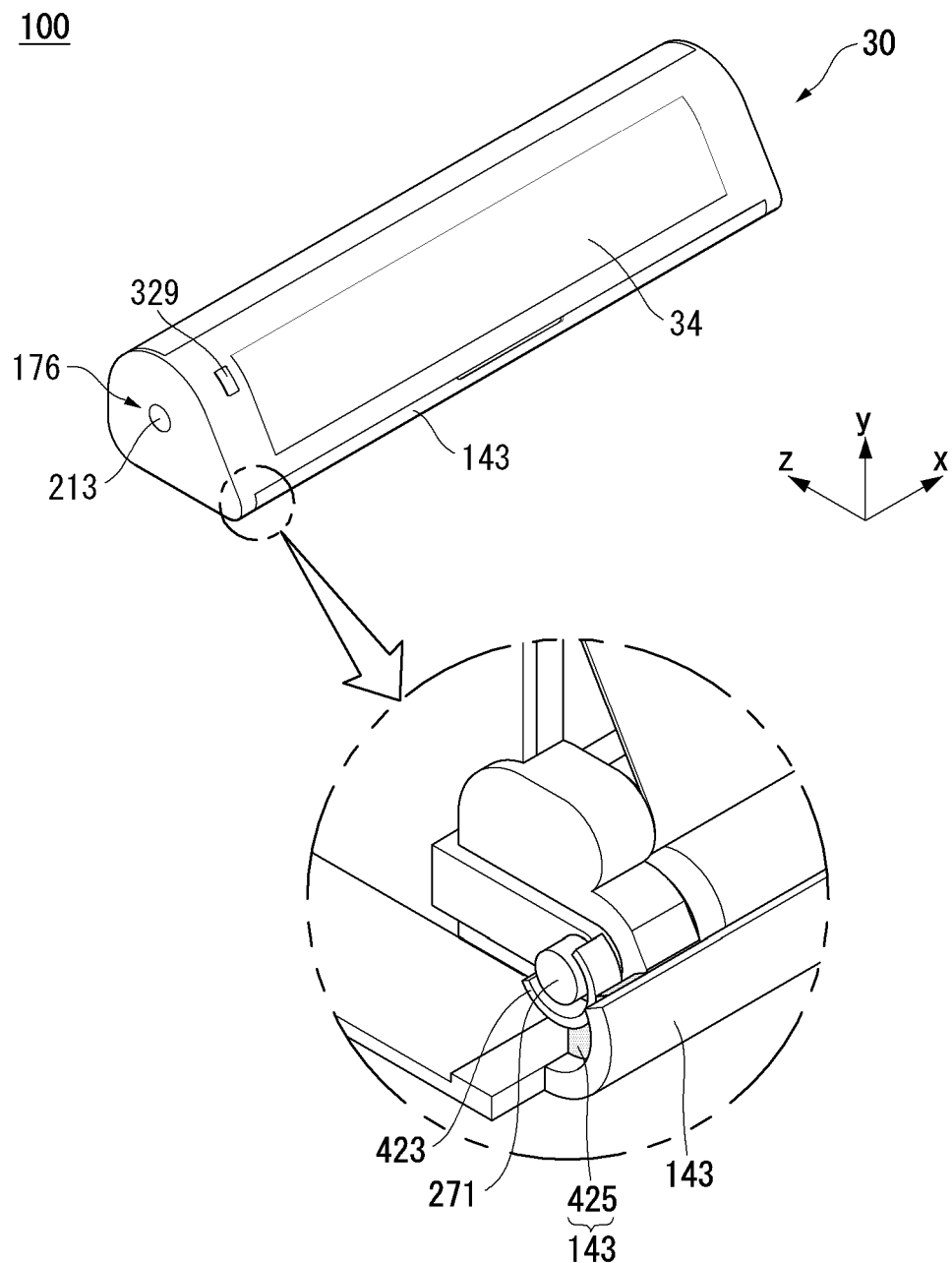

Referring to FIG. 27, the knob 143 may include a magnet 425 positioned inside the knob 143. The magnet 425 may include a magnetic material. Further, one surface of the magnet 425 may be covered by the knob 143.

Sheets 423 may be positioned at both ends inside the housing 30. The sheet 423 may be positioned corresponding to the magnet 425 when the knob 143 is coupled to the housing 30. The sheet 423 may include a metal material. Hence, the sheet 423 may be strongly coupled to the magnet 425 using magnetic properties. The sheet 423 may have a semi-circular shape corresponding to a shape of the magnet 425. When the knob 143 is coupled to the housing 30, the magnet 425 may have the shape covering the sheet 423.

A hall sensor 271 may be positioned inside the sheet 423. The hall sensor 271 may be positioned corresponding to the magnet 425 when the knob 143 is coupled to the housing 30. The hall sensor 271 may have a circular shape. The hall sensor 271 may be spaced apart from the sheet 423 and covered by the sheet 423.

The hall sensor 271 may sense a magnetic field of the magnet 425. More specifically, the hall sensor 271 may sense a magnetic field of the magnet 425 adjacent to the hall sensor 271 when the knob 143 is coupled to the housing 30. When the hall sensor 271 senses the magnetic field of the magnet 425, a portion of the display panel 20 corresponding to the window 34 may be activated.

The electronic device 100 according to the embodiment of the disclosure may sense whether or not the knob 143 is coupled to the housing 30, using the hall sensor 271. Hence, the user can watch the display screen through the window 34 in the first state without another operation.

Accordingly, an object of the present disclosure is to address the above-described and other problems.

Another aspect of the present disclosure is to provide an electronic device capable of mounting various electronic parts inside an inner frame.

In one aspect, there is provided an electronic device including a housing, a roller positioned inside the housing, a display panel rollable on the roller, and a guide roller positioned at an edge inside the housing, wherein a state of the display panel with respect to the roller includes a first state in which the display panel is rolled on the roller and a second state in which the display panel is unrolled from the roller.

The guide roller may include first to fourth guide rollers. The first to third guide rollers may guide the display panel in a first rotational direction. The fourth guide roller may guide the display panel in a second rotational direction opposite the first rotational direction.

The fourth guide roller may be spaced apart from the edge by a predetermined distance.

The guide roller may include first to third guide rollers. The first to third guide rollers may guide the display panel in a second rotational direction.

The housing may include a window that is positioned on the housing and is see-through.

A display screen may be displayed on a portion of the display panel inside the housing, and the portion of the display panel may be corresponding to the window.

A display screen displayed on another portion of the display panel exposed to the outside of the housing in the second state may be the same as the display screen displayed on the portion of the display panel corresponding to the window.

A display screen displayed on another portion of the display panel exposed to the outside of the housing in the second state may be different from the display screen displayed on the portion of the display panel corresponding to the window.

A display screen may be displayed on the portion of the display panel corresponding to the window only when the display panel is in the first state.

The electronic device may further include a sub-display panel positioned on an inner surface of the housing at a location corresponding to the window.

The display panel may include a pattern having at least one valley portion and at least one peak portion.

The pattern may include a magnetic material.

The housing may include a hall sensor positioned inside a front surface of the housing. The pattern may have a line connecting the at least one valley portion and the at least one peak portion. The hall sensor may sense the line when the line passes by the hall sensor.

The electronic device may further include a controller configured to generate a control signal. The controller may activate at least a portion of the display panel in accordance with lines sensed by the hall sensor.

The housing may include a window on the housing, and the window may include a transparent material. The at least the portion of the display panel may be corresponding to the window.

The electronic device may further include a controller configured to generate a control signal. The controller may activate at least a portion of the display panel in accordance with a distance between lines sensed by the hall sensor.

The electronic device may further include a controller configured to generate a control signal. The controller may adjust an aspect ratio of a display screen displayed on the display panel based on a width of the display panel exposed to the outside, so that the display screen is displayed on an exposed portion of the display panel.

Two neighboring valley portions of the pattern among the valley portions of the pattern may be spaced apart from each other by a uniform distance.

At least one of distances between neighboring valley portions may be different from at least one of distances between other neighboring valley portions.

The electronic device may further include a knob positioned on at least one surface of the housing and rolling and unrolling the display panel.

The roller may include an outer frame which rotates when the display panel is rolled on or unrolled from the roller, and an inner frame positioned inside the outer frame and fixed to an inside of the housing regardless of rolling and unrolling the display panel.

At least one printed circuit board may be mounted at an end of the inner frame and positioned in the inner frame.

A battery may be mounted at another end of the inner frame and positioned in the inner frame The inner frame and the outer frame may be connected to each other through at least one wire.

The inner frame may include a wire hole positioned at a side of the inner frame, and the wire connected from the outer frame may be inserted into the wire hole.

The electronic device may further include a touch pen inserted into the housing. The touch pen may be inserted into an insertion hole depressed to an inside of the inner frame.

A spring may be positioned at one end of the insertion hole and may hold the touch pen.

The inner frame may include a contact terminal protruding toward a surface of the housing, and the contact terminal may be positioned at an end of the inner frame and includes a conductive material.

The contact terminal may contact a flexible printed circuit board attached to an inner surface of the housing and may transfer an electrical signal from the flexible printed circuit board to the inner frame.

The contact terminal may contact a pad on the flexible printed circuit board, and the pad may be positioned at a location corresponding to the contact terminal.

The electronic device may further include a motor assembly positioned in the housing and coupled with the roller.

The motor assembly may include a motor, a pinion gear connected to the motor, and a ring gear having a ring shape including an outer periphery. The pinion gear may have the same shaft as the motor, and the outer periphery of the ring gear may contact the pinion gear.

The pinion gear may have a sawtooth shape, and the pinion gear may be geared in the outer periphery of the ring gear.

The electronic device may further include a knob positioned on at least one surface of the housing, and the knob may be configured to roll and unroll the display panel.

The knob may include a groove formed on a middle portion of the knob.

The housing may include a power button positioned on an outer surface of the housing, a control button positioned on the outer surface of the housing, and plates positioned on an inner surface of the housing at a location corresponding to the power button and the control button, respectively.

The plates may protrude toward the inside of the housing.

The electronic device may further include a sub-display panel positioned on the housing and displaying a display screen.

The housing may include a window that is positioned on the housing and is see-through. A display screen may be displayed on a portion of the display panel, and the portion of the display may be corresponding to the window.

The roller may include a wind spring that is positioned on the roller and applies a torque to the roller.

According to at least one aspect of the present disclosure, the present disclosure can provide an electronic device, in which various electronic parts are mounted inside an inner frame because the inner frame does not rotate regardless of rolling and unrolling a display panel.

Additional features and advantages of the disclosure will be set forth in the description which follows, and in part will be apparent from the description, or may be learned by practice of the disclosure. It is to be understood that both the foregoing general description and the following detailed description are exemplary and explanatory and are intended to provide further explanation of the disclosure as claimed.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic device comprising:
 a housing;
 a roller positioned in a central area of the housing;
 a display panel to be provided on the roller, the display panel to move between a first state and a second state, the display panel is to overlap with and is rollable on the roller; and
 at least one guide roller at an edge in the housing,
 wherein the roller includes:
  an outer frame that rotates when the display panel changes from the first state to the second state, and that rotates when the display panel changes from the second state to the first state; and
  an inner frame provided inside the outer frame and attached to the housing,
 wherein when the display panel is in the first state, at least a portion of the display panel is rolled on the roller, and in the second state, at least a portion of the display panel is unrolled from the roller and is exposed to outside of the housing,
 wherein a diameter of the roller is greater than a diameter of the at least one guide roller, and
 wherein a diameter of a first end of the inner frame is greater than a diameter of the outer frame, and a diameter of a second end of the inner frame, opposite to the first end, is greater than the diameter of the outer frame, and
 the first end of the inner frame includes a plane inclined towards a middle portion of the inner frame.

2. The electronic device of claim 1, wherein the at least one guide roller includes a first guide roller, a second guide roller, a third guide roller and a fourth guide roller, wherein the first, second and third guide rollers to guide a first surface of the display panel, and wherein the fourth guide roller to guide a second surface of the display panel.

3. The electronic device of claim 2, wherein the fourth guide roller is spaced from the edge in the housing by a predetermined distance.

4. The electronic device of claim 1, wherein the housing includes a window.

5. The electronic device of claim 4, wherein a first display screen is displayed on at a first portion of the display panel in the housing, and the first portion of the display panel corresponds to the window.

6. The electronic device of claim 5, wherein a second display screen is displayed at on outside of the housing when the display panel is in the second state, and the second display screen is the same as the first display screen displayed on the first portion of the display panel corresponding to the window.

7. The electronic device of claim 5, wherein when the display panel is in the second state, a second display screen displayed at a second portion of the display panel exposed to outside of the housing is different from the first display screen displayed at the first portion of the display panel corresponding to the window.

8. The electronic device of claim 5, wherein a first display screen is displayed at the first portion of the display panel corresponding to the window only when the display panel is in the first state.

9. The electronic device of claim 1, wherein a pattern is displayed on the display panel, the pattern having at least one valley portion and at least one peak portion.

10. The electronic device of claim 9, wherein the pattern is made of a magnetic material.

11. The electronic device of claim 9, comprising a hall sensor in the housing, wherein the hall sensor senses a magnetic field when portions of the pattern pass the hall sensor.

12. The electronic device of claim 11, further comprising a controller configured to activate at least a portion of the display panel based on magnetic fields sensed by the hall sensor.

13. The electronic device of claim 11, further comprising a controller configured to activate at least a portion of the display panel based on a distance between lines sensed by the hall sensor.

14. The electronic device of claim 11, further comprising a controller configured to change an aspect ratio of a display screen at the display panel based on a width of the display panel exposed to the outside of the housing such that the display screen is displayed on an exposed portion of the display panel.

15. The electronic device of claim 9, wherein a first distance between a first valley portion and a neighboring second valley portion of the pattern is same as a second distance between a third valley portion and a neighboring fourth valley portion of the pattern.

16. The electronic device of claim 9, wherein a first distance between a first valley portion and a neighboring second valley portion of the pattern is different than a second distance between a third valley portion and a neighboring fourth valley portion of the pattern.

17. The electronic device of claim 1, further comprising a knob at an edge of the display panel to roll and unroll the display panel from the roller.

18. The electronic device of claim 1, comprising at least one printed circuit board in the inner frame.

19. The electronic device of claim 1, comprising a battery in the inner frame.

20. The electronic device of claim 1, wherein the inner frame and the outer frame are coupled to each other by at least one wire.

21. The electronic device of claim 20, wherein the inner frame includes a wire hole at a side of the inner frame, and wherein the wire coupled from the outer frame is inserted into the wire hole.

22. The electronic device of claim 1, further comprising a touch pen to be inserted into the housing, wherein the touch pen is to be inserted into an insertion hole at an inside of the inner frame.

23. The electronic device of claim 22, comprising a spring at an end of the insertion hole to support the touch pen.

24. The electronic device of claim 1, further comprising a motor assembly in the housing and coupled to the roller.

25. The electronic device of claim 24, wherein the inner frame includes a contact terminal to protrude toward the housing, and wherein the contact terminal is at an end of the inner frame, and the contact terminal is a conductive material.

26. The electronic device of claim 25, wherein the contact terminal contacts a flexible printed circuit board coupled to the housing, and the contact terminal to transfer an electrical signal from the flexible printed circuit board to the inner frame.

27. The electronic device of claim 26, wherein the contact terminal to contact a pad on the flexible printed circuit board, and wherein the pad is at the contact terminal.

28. The electronic device of claim 24, wherein the motor assembly includes:
 a motor;
 a pinion gear coupled to the motor; and
 a ring gear having a ring shape an having a periphery, wherein the pinion gear has a same shaft as the motor, and wherein the periphery of the ring gear contacts the pinion gear.

29. The electronic device of claim 1, further comprising a knob on at least one surface of the housing,
 wherein the knob is configured to roll and unroll the display panel.

30. The electronic device of claim 29, wherein the knob includes a groove on a portion of the knob.

31. The electronic device of claim 1, wherein the housing includes:
 a power button on a surface of the housing;
 a control button on the surface of the housing; and
 plates on a surface of the housing at a location corresponding to the power button and the control button, respectively.

32. The electronic device of claim 31, wherein the plates protrude toward inside of the housing.

33. The electronic device of claim 1, comprising a wind spring on the roller and to apply a torque to the roller.

34. An electronic device comprising:
 a housing;
 a wrapping device in a central area of the housing;
 a display panel to be provided on the wrapping device, the display panel to change from a first state to a second state, the display panel is to overlap with and is rollable on the wrapping device; and
 a plurality of guide rollers to guide the display panel from the wrapping device to outside of the housing, wherein in the first state, at least a portion of the display panel is wrapped around the wrapping device, and in the second state, at least a portion of the display panel is removed from the wrapping device,
 wherein the wrapping device includes:
  an outer frame that rotates when the display panel changes from the first state to the second state, and that rotates when the display panel changes from the second state to the first state, and
  an inner frame provided inside the outer frame and attached to the housing,
 wherein a diameter of the wrapping device is greater than a diameter of each separate one of the guide rollers, and
 wherein a diameter of a first end of the inner frame is greater than a diameter of the outer frame, and a diameter of a second end of the inner frame, opposite to the first end, is greater than the diameter of the outer frame, and
 the first end of the inner frame includes a plane inclined towards a middle portion of the inner frame.

35. The electronic device of claim 34, wherein the plurality of guide rollers includes a first guide roller to contact a first surface of the display panel, and a second guide roller to contact a second surface of the display panel.

36. The electronic device of claim 34, comprising a magnetic pattern on the display panel, and a sensor to sense movement of the magnetic pattern.

37. An electronic device comprising:
 a housing;
 a display panel to move between a first position to a second position, wherein when the display panel is in the second position, a portion of the display panel is external of the housing;
 a rotating device, at a central area of the housing, to move the display panel between the first position and the second position, the display panel is to overlap with and is rollable on the rotating device; and
 a plurality of guide rollers to guide the display panel such that the portion of the display panel is external to the housing when the display panel is in the second position,
 wherein the rotating device includes:
  an outer frame that rotates when the display panel changes from the first position to the second position, and that rotates when the display panel changes from the second position to the first position; and
  an inner frame provided inside the outer frame and attached to the housing,
 wherein a diameter of the rotating device is greater than a diameter of each separate one of the guide rollers, and
 wherein a diameter of a first end of the inner frame is greater than a diameter of the outer frame, and a diameter of a second end of the inner frame, opposite to the first end, is greater than the diameter of the outer frame, and
 the first end of the inner frame includes a plane inclined towards a middle portion of the inner frame.

38. The electronic device of claim 37, wherein the plurality of guide rollers includes a first guide roller to contact a first surface of the display panel, and a second guide roller to contact a second surface of the display panel.

39. The electronic device of claim 37, comprising a magnetic pattern on the display panel, and a sensor to sense movement of the magnetic pattern.

* * * * *